United States Patent
Panagopoulos et al.

(10) Patent No.: US 11,380,556 B2
(45) Date of Patent: Jul. 5, 2022

(54) THERMAL ATOMIC LAYER ETCH WITH RAPID TEMPERATURE CYCLING

(71) Applicant: Lam Research Corporation, Fremont, CA (US)

(72) Inventors: Theodoros Panagopoulos, Los Gatos, CA (US); Andreas Fischer, Castro Valley, CA (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/103,519

(22) Filed: Nov. 24, 2020

(65) Prior Publication Data

US 2021/0104414 A1    Apr. 8, 2021

Related U.S. Application Data

(63) Continuation of application No. PCT/US2019/031165, filed on May 7, 2019.
(Continued)

(51) Int. Cl.
*H01L 21/311* (2006.01)
*H01L 21/3213* (2006.01)
*H01L 21/02* (2006.01)

(52) U.S. Cl.
CPC .. *H01L 21/31122* (2013.01); *H01L 21/32138* (2013.01); *H01L 21/0206* (2013.01); *H01L 21/02071* (2013.01)

(58) Field of Classification Search
CPC ......... H01L 21/31122; H01L 21/32138; H01L 21/0206; H01L 21/02071
See application file for complete search history.

(56) References Cited

U.S. PATENT DOCUMENTS 4,313,782 A    2/1982  Sokoloski
4,414,069 A    11/1983 Cuomo
(Continued)

FOREIGN PATENT DOCUMENTS

CN    102934208 A    2/2013
CN    103117216 A    5/2013
(Continued)

OTHER PUBLICATIONS

U.S. Office Action, dated May 2, 2007, issued in U.S. Appl. No. 11/479,812.
(Continued)

*Primary Examiner* — Binh X Tran
(74) *Attorney, Agent, or Firm* — Weaver Austin Villeneuve & Sampson LLP

(57) ABSTRACT

Disclosed are apparatuses and methods for performing atomic layer etching. A method may include supporting and thermally floating a substrate in a processing chamber, modifying one or more surface layers of material on the substrate by chemical adsorption, without using a plasma, while the substrate is maintained at a first temperature, and removing the one or more modified surface layers by desorption, without using a plasma, while the substrate is maintained at a second temperature, the first temperature being different than the second temperature. An apparatus may include a processing chamber and support features configured to support and thermally float a substrate in the chamber, a process gas unit configured to flow a first process gas onto the substrate, a substrate heating unit configured to heat the substrate, and a substrate cooling unit configured to actively cool the substrate.

16 Claims, 13 Drawing Sheets

Related U.S. Application Data

(60) Provisional application No. 62/676,512, filed on May 25, 2018.

(56) References Cited

U.S. PATENT DOCUMENTS

| | | |
|---|---|---|
| 4,695,327 A | 9/1987 | Grebinski |
| 4,756,794 A | 7/1988 | Yoder |
| 5,030,319 A | 7/1991 | Nishino et al. |
| 5,078,832 A | 1/1992 | Tanaka |
| 5,234,540 A | 8/1993 | Grant et al. |
| 5,268,069 A | 12/1993 | Chapple-Sokol et al. |
| 5,282,925 A | 2/1994 | Jeng et al. |
| 5,431,772 A | 7/1995 | Babie et al. |
| 5,439,553 A | 8/1995 | Grant et al. |
| 5,474,641 A | 12/1995 | Otsuki et al. |
| 5,505,816 A | 4/1996 | Barnes et al. |
| 5,620,559 A | 4/1997 | Kikuchi |
| 5,635,102 A | 6/1997 | Mehta |
| 5,636,320 A | 6/1997 | Yu et al. |
| 5,766,971 A | 6/1998 | Ahlgren et al. |
| 5,792,275 A | 8/1998 | Natzle et al. |
| 5,838,055 A | 11/1998 | Kleinhenz et al. |
| 5,858,830 A | 1/1999 | Yoo et al. |
| 5,876,879 A | 3/1999 | Kleinhenz et al. |
| 5,880,032 A | 3/1999 | Doi et al. |
| 5,913,140 A | 6/1999 | Roche et al. |
| 5,922,624 A | 7/1999 | Verhaverbeke et al. |
| 5,968,279 A | 10/1999 | Macleish et al. |
| 5,976,973 A | 11/1999 | Ohira et al. |
| 5,990,019 A | 11/1999 | Torek et al. |
| 5,994,240 A | 11/1999 | Thakur |
| 6,030,881 A | 2/2000 | Papasouliotis et al. |
| 6,069,092 A | 5/2000 | Imai et al. |
| 6,071,815 A | 6/2000 | Kleinhenz et al. |
| 6,074,951 A | 6/2000 | Kleinhenz et al. |
| 6,146,970 A | 11/2000 | Witek et al. |
| 6,204,198 B1 | 3/2001 | Banerjee et al. |
| 6,265,302 B1 | 7/2001 | Lim et al. |
| 6,335,261 B1 | 1/2002 | Natzle et al. |
| 6,483,154 B1 | 11/2002 | Ngo et al. |
| 6,573,181 B1 | 6/2003 | Srinivas et al. |
| 6,652,713 B2 | 11/2003 | Brown et al. |
| 6,693,050 B1 | 2/2004 | Cui et al. |
| 6,706,334 B1 | 3/2004 | Kobayashi et al. |
| 6,716,691 B1 | 4/2004 | Evans et al. |
| 6,726,805 B2 | 4/2004 | Brown et al. |
| 6,740,247 B1 | 5/2004 | Han et al. |
| 6,774,000 B2 | 8/2004 | Natzle et al. |
| 6,776,874 B2 | 8/2004 | Kobayashi et al. |
| 6,790,733 B1 | 9/2004 | Natzle et al. |
| 6,803,309 B2 | 10/2004 | Chou et al. |
| 6,817,776 B2 | 11/2004 | Colgan et al. |
| 6,837,968 B2 | 1/2005 | Brown et al. |
| 6,852,584 B1 | 2/2005 | Chen et al. |
| 6,858,532 B2 | 2/2005 | Natzle et al. |
| 6,905,965 B2 | 6/2005 | Subrahmanyan et al. |
| 6,926,843 B2 | 8/2005 | Cantell et al. |
| 6,949,481 B1 | 9/2005 | Hallijal et al. |
| 6,951,821 B2 | 10/2005 | Hamelin et al. |
| 6,967,167 B2 | 11/2005 | Geiss et al. |
| 6,992,011 B2 | 1/2006 | Nemoto et al. |
| 7,029,536 B2 | 4/2006 | Hamelin et al. |
| 7,033,909 B2 | 4/2006 | Kim et al. |
| 7,052,941 B2 | 5/2006 | Lee et al. |
| 7,079,760 B2 | 7/2006 | Hamelin et al. |
| 7,163,899 B1 | 1/2007 | Cho et al. |
| 7,416,989 B1 | 8/2008 | Liu et al. |
| 7,435,661 B2 | 10/2008 | Miller et al. |
| 7,651,922 B2 | 1/2010 | Matsuda |
| 7,977,249 B1 | 7/2011 | Liu et al. |
| 7,981,763 B1 | 7/2011 | Van Schravendijk et al. |
| 8,043,972 B1 | 10/2011 | Liu et al. |
| 8,058,179 B1 | 11/2011 | Draeger et al. |
| 8,187,486 B1 | 5/2012 | Liu et al. |
| 8,617,348 B1 | 12/2013 | Liu et al. |
| 9,425,041 B2 | 8/2016 | Berry, III et al. |
| 9,431,268 B2 | 8/2016 | Lill et al. |
| 9,773,683 B2 | 9/2017 | Gupta et al. |
| 10,679,868 B2 | 6/2020 | Berry, III et al. |
| 2001/0016226 A1 | 8/2001 | Natzle et al. |
| 2002/0106908 A1 | 8/2002 | Cohen et al. |
| 2003/0029568 A1 | 2/2003 | Brown et al. |
| 2003/0134038 A1 | 7/2003 | Paranjpe |
| 2004/0018740 A1 | 1/2004 | Brown et al. |
| 2004/0083977 A1 | 5/2004 | Brown et al. |
| 2004/0110354 A1 | 6/2004 | Natzle et al. |
| 2004/0182324 A1 | 9/2004 | Wallace et al. |
| 2004/0184792 A1 | 9/2004 | Hamelin et al. |
| 2004/0185670 A1 | 9/2004 | Hamelin et al. |
| 2004/0200244 A1 | 10/2004 | Hung et al. |
| 2004/0212035 A1 | 10/2004 | Yeo et al. |
| 2005/0056370 A1 | 3/2005 | Brown et al. |
| 2005/0101130 A1 | 5/2005 | Lopatin et al. |
| 2005/0106877 A1 | 5/2005 | Elers et al. |
| 2005/0116300 A1 | 6/2005 | Hieda et al. |
| 2005/0153519 A1 | 7/2005 | Lu et al. |
| 2005/0205110 A1 | 9/2005 | Kao et al. |
| 2005/0218113 A1 | 10/2005 | Yue |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0266684 A1 | 12/2005 | Lee et al. |
| 2005/0270895 A1 | 12/2005 | Strang |
| 2006/0003596 A1 | 1/2006 | Fucsko et al. |
| 2006/0051966 A1 | 3/2006 | Or et al. |
| 2006/0115937 A1 | 6/2006 | Barnett et al. |
| 2006/0207968 A1 | 9/2006 | Mumbauer et al. |
| 2007/0063277 A1 | 3/2007 | Belyansky et al. |
| 2007/0215975 A1 | 9/2007 | Idani et al. |
| 2008/0233709 A1 | 9/2008 | Conti et al. |
| 2009/0181553 A1 | 7/2009 | Koelmel et al. |
| 2010/0062602 A1 | 3/2010 | Sakamoto et al. |
| 2011/0056625 A1 | 3/2011 | Rueger et al. |
| 2015/0118848 A1 | 4/2015 | Draeger et al. |
| 2015/0132961 A1 | 5/2015 | Chang et al. |
| 2016/0196969 A1* | 7/2016 | Berry, III ............ H01L 21/0274 438/694 |
| 2016/0196984 A1 | 7/2016 | Lill et al. |
| 2016/0329221 A1 | 11/2016 | Berry, III et al. |
| 2017/0221781 A1* | 8/2017 | Theisen ............ H01L 21/67253 |
| 2017/0256416 A1 | 9/2017 | Fischer et al. |
| 2017/0345665 A1* | 11/2017 | Faguet ............ H01L 21/67069 |
| 2017/0365478 A1* | 12/2017 | George ............ C23F 1/12 |
| 2019/0131120 A1* | 5/2019 | Yamaguchi ............ C23C 16/405 |
| 2021/0280433 A1 | 9/2021 | Berry, III et al. |

FOREIGN PATENT DOCUMENTS

| | | |
|---|---|---|
| EP | 298879 | 1/1989 |
| JP | 7404161 | 11/1974 |
| JP | 05-029266 A | 2/1993 |
| JP | 05-190517 A | 7/1993 |
| JP | 06-295889 A | 10/1994 |
| JP | H 09-102490 A | 4/1997 |
| JP | 2006-261451 A | 9/2006 |
| KR | 10-2005-0110751 | 11/2005 |
| KR | 10-2006-0000876 | 1/2006 |
| KR | 10-2007-0029851 | 3/2007 |
| WO | WO 2004/001809 | 12/2003 |
| WO | WO 2017/205658 | 11/2017 |

OTHER PUBLICATIONS

U.S. Final Office Action, dated Jul. 17, 2007, issued in U.S. Appl. No. 11/479,812.

U.S. Office Action, dated Dec. 5, 2007, issued in U.S. Appl. No. 11/479,812.

U.S. Final Office Action, dated May 7, 2008, issued in U.S. Appl. No. 11/479,812.

U.S. Notice of Allowance, dated Jul. 1, 2008, issued in U.S. Appl. No. 11/479,812.

U.S. Office Action, dated Feb. 15, 2011, issued in U.S. Appl. No. 12/174,402.

(56) References Cited

OTHER PUBLICATIONS

U.S. Notice of Allowance, dated Jul. 13, 2011, issued in U.S. Appl. No. 12/174,402.
U.S. Notice of Allowance, dated Mar. 7, 2011, issued in U.S. Appl. No. 12/074,912.
U.S. Office Action, dated Jun. 9, 2011, issued in U.S. Appl. No. 12/002,171.
U.S. Final Office Action, dated Nov. 17, 2011, issued in U.S. Appl. No. 12/002,171.
U.S. Office Action, dated Apr. 12, 2011, issued in U.S. Appl. No. 12/002,085.
U.S. Office Action, dated Sep. 30, 2011, issued in U.S. Appl. No. 12/002,085.
U.S. Notice of Allowance, dated Feb. 3, 2012, issued in U.S. Appl. No. 12/002,085.
U.S. Office Action, dated Jan. 17, 2013, issued in U.S. Appl. No. 13/461,080.
U.S. Final Office Action, dated Jun. 26, 2013, issued in U.S. Appl. No. 13/461,080.
U.S. Notice of Allowance, dated Aug. 28, 2013, issued in U.S. Appl. No. 13/461,080.
U.S. Office Action, dated Feb. 3, 2011, issued in U.S. Appl. No. 12/244,241.
U.S. Office Action, dated Jan. 29, 2010, issued in U.S. Appl. No. 12/144,518.
U.S. Office Action, dated Jun. 14, 2010, issued in U.S. Appl. No. 12/144,518.
U.S. Office Action, dated Jun. 11, 2010, issued in U.S. Appl. No. 12/341,943.
U.S. Final Office Action, dated Dec. 23, 2010, issued in U.S. Appl. No. 12/341,943.
U.S. Notice of Allowance, dated Mar. 15, 2011, issued in U.S. Appl. No. 12/341,943.
U.S. Office Action, dated Apr. 21, 2011, issued in U.S. Appl. No. 12/343,102.
U.S. Notice of Allowance, dated Sep. 14, 2011, issued in U.S. Appl. No. 12/343,102.
U.S. Office Action, dated Nov. 22, 2013, issued in U.S. Appl. No. 13/244,032.
U.S. Final Office Action, dated Jul. 2, 2014, issued in U.S. Appl. No. 13/244,032.
U.S. Office Action, dated Apr. 9, 2015, issued in U.S. Appl. No. 14/531,483.
U.S. Office Action, dated Dec. 30, 2015, issued in U.S. Appl. No. 14/531,483.
U.S. Office Action, dated Dec. 21, 2015, issued in U.S. Appl. No. 14/589,610.
U.S. Notice of Allowance, dated May 2, 2016, issued in U.S. Appl. No. 14/589,610.
U.S. Office Action, dated Mar. 1, 2016, issued in U.S. Appl. No. 14/590,801.
U.S. Notice of Allowance, dated Jul. 12, 2016, issued in U.S. Appl. No. 14/590,801.
U.S. Office Action, dated Dec. 3, 2018, issued in U.S. Appl. No. 15/216,257.
U.S. Final Office Action, dated May 21, 2019 issued in U.S. Appl. No. 15/216,257.
U.S. Office Action, dated Sep. 23, 2019 issued in U.S. Appl. No. 15/216,257.
U.S. Notice of Allowance dated Feb. 10, 2020 issued in U.S. Appl. No. 15/216,257.
Korean Office Action dated Apr. 8, 2014, issued in KR 10-2008-0063247.
European Extended Search Report dated May 30, 2016 issued in Application No. EP 15200663.1.
Chinese First Office Action dated Dec. 22, 2017 issued in Application No. CN 201511027151.7.
Chinese Second Office Action dated Aug. 16, 2018 issued in Application No. CN 201511027151.7.
Chinese Decision of Final Rejection Action dated Feb. 11, 2019 issued in Application No. CN 201511027151.7.
Chinese Third Office Action [Reinstated] dated Jul. 15, 2019 issued in Application No. CN 201511027151.7.
Chinese Fourth Office Action dated Sep. 27, 2019 issued in Application No. CN 201511027151.7.
Japanese First Office Action dated Jan. 28, 2020 issued in Application No. JP 2015-250922.
Singapore Notice of Allowance and Supplementary Examination Report dated Jul. 1, 2019 issued in Application No. SG 10201600021U.
Taiwan First Office Action dated Jun. 27, 2019 issued in Application No. TW 104143047.
Taiwan Notice of Allowance dated Oct. 1, 2019 issued in Application No. TW 104143047.
Chinese First Office Action dated Dec. 5, 2017 issued in Application No. CN 201511021815.9.
Chinese Second Office Action dated Jul. 31, 2018 issued in Application No. CN 201511021815.9.
Chinese Third Office Action dated Jan. 22, 2019 issued in Application No. CN 201511021815.9.
Chinese Decision of Final Rejection dated Apr. 25, 2019 issued in Application No. CN 201511021815.9.
Chinese Fourth Office Action dated Sep. 27, 2019 issued in Application No. CN 201511021815.9.
Chinese Notice of Allowance, dated Nov. 26, 2019 issued in Application No. CN 201511021815.9.
International Search Report and Written Opinion dated Aug. 22, 2019 issued in Application No. PCT/US2019/031165.
International Preliminary Report on Patentability dated Dec. 10, 2020 issued in Application No. PCT/US2019/031165.
International Search Report and Written Opinion dated Oct. 31, 2019 issued in Application No. PCT/US2019/040490.
International Preliminary Report on Patentability dated Jan. 21, 2021 issued in Application No. PCT/US2019/040490.
Athavale, S. et al. (1995) "Molecular dynamics simulation of atomic layer etching of silicon," J. Vac. Sci. Technol. A, 13(3):966-971.
Byun et al. (2001) "The Effects of Reactive Precleaning (RPC+) on the Formation of Titanium Silicide by PECVD TiCl4—Ti Deposition, and Its Thermal Stability," IEEE, pp. 222-224.
Chang et al. (1997) "Interface Characteristics of Selective Tungsten on Silicon Using a New Pretreatment Technology for ULSI Application," IEEE, p. 738 743.
Chen et al., "Directional etch of magnetic and noble metals. II. Organic chemical vapor etch" Journal of Vacuum Science & Technology A: Vacuum, Surfaces, and Films, vol. 35, 05C305 (2017) pp. 1-8. <doi:10.1116/1.4983830>.
George, et al., "Prospects for Thermal Atomic Layer Etching Using Sequential, Self-Limiting Fluorination and Ligand-Exchange Reactions" ACS Nano (2016) vol. 10, 4889-4894.
Honda et al. (2005) "Chemical Dry Cleaning Technology for Reliable 65nm CMOS contact to NiSix," IITC, paper 9.4.
Jang et al. (2002) "Fabrication of MEMS devices by using anhydrous HF gas-phase etching with alcoholic vapor," Journal of Micromechanics and Microengineering, 12:297-306.
Kim et al. (2003) "New Contact Cleaning in HF & N2/H2 Microwave Plasma," Solid State Phenomena, 92:239-242.
Matsuo et al. (Sep./Oct. 1999) "Silicon etching in NF3/O2 remote microwave plasmas," J. Vac. Sci. Technol. A, 17(5):2431-2437.
Meguro et al. (1990) "Digital etching of GaAs: New approach of dry etching to atomic ordered processing," American Institute of Physics pp. 1552-1554.
Natzle et al. (2004) "Trimming of hard-masks by Gaseous Chemical Oxide Removal (COR) for Sub-10nm Gates/Fins, for Gate Length Control and for Embedded Logic," 2004 IEEE/SEMI Advanced Semiconductor Manufacturing Conference, pp. 61-65.
Nishino, H. et al. (1993) "Damage-free selective etching of Si native oxides using NH3/NF3 and SF6/H2O down-flow etching," J. Appl. Phys. 74(2):1345-1348.
Ogawa, H. et al. (2002) "Dry Cleaning Technology for Removal of Silicon Native Oxide Employing Hot NH3/NF3 Exposure," The Japan Society of Applied Physics, Part I, No. 8, pp. 5349-5358.

(56) References Cited

OTHER PUBLICATIONS

Okamura, H. et al. (2004) "Low Damage Via Formation with Low Resistance by NH3 Thermal Reduction for Cu / Ultra Low-k Interconnects," IEEE, pp. 42-44.

Park, I.S. et al. (1996) "Low Damage In Situ Contact Cleaning Method by a Highly Dense and Directional ECR Plasma," Jpn J. Appl. Phys 35:1097-1101.

Park, S.D. et al. (2005) "Atomic Layer Etching of Si(100) and Si(111) Using Cl2 and Ar Neutral Beam," Electrochemical and Solid-State Letters, 8(8) C106-C109.

Phan, S. et al. (2006) "Integrated Clean Process Using NF3/NH3 Remote Plasma for Nickle Silicide Formation," SEMICON Korea STS 2006, pp. 159-163.

Taguwa et al. (2000) "ICP-Ar/H2 Precleaning and Plasma Damage-Free Ti-PECVD for Sub-Quarter Micron Contact of Logic with Embedded DRAM," Conference Proceedings USLI XV 2000, pp. 589-593.

Torek et al. (1995) "Reduced pressure etching of thermal oxides in anhydrous HF/alcoholic gas mixtures" Journal of the Electrochemical Society, vol. 142, No. 4, Apr. 1995, pp. 1322-1326. <ISSN:0013-4651>.

Wang, Ying and Leroy Luo, "Ultrahigh-selectivity silicon nitride etch process using an inductively coupled plasma source," J. Vac. Sci. Technol. A, (Jan. 1998), 16(3):1582-1587.

Yun et al. (2007) "Large Etch Rate Enhancement by NO-Induced Surface Chemical Reaction during Chemical Dry Etching of Silicon Oxide in F2 Remote Plasmas" Journal of The Elctrochemical Society, vol. 154, No. 4, pp. D267-D272.

U.S. Appl. No. 12/002,171, filed Dec. 14, 2007, van Schravendijk et al.

U.S. Appl. No. 12/244,241, filed Oct. 2, 2008, Drewery et al.

U.S. Appl. No. 12/144,518, filed Jun. 23, 2008, Drewery et al.

U.S. Appl. No. 13/244,032, filed Sep. 23, 2011, Draeger et al.

U.S. Appl. No. 17/250,326, filed Jan. 5, 2021, Berry III et al.

\* cited by examiner

THERMAL ATOMIC LAYER ETCH WITH RAPID TEMPERATURE CYCLING

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Semiconductor fabrication often involves patterning schemes and other processes whereby some materials are selectively etched to prevent etching of other exposed surfaces of a substrate. As device geometries become smaller and smaller, high etch selectivity processes are desirable to achieve effective etching of desired materials without plasma assistance.

SUMMARY

In some embodiments, a method of processing a substrate may be provided. The method may include supporting and thermally floating a substrate in a processing chamber, modifying one or more surface layers of material on the substrate by chemical adsorption, without using a plasma, while the substrate is maintained at a first temperature, and removing the one or more modified surface layers on the substrate by desorption, without using a plasma, while the substrate is maintained at a second temperature higher than the first temperature. The first temperature may be different from the second temperature In some embodiments, the second temperature may be higher than the first temperature.

In some embodiments, the modifying may further include modifying a metal or metal oxide on the one or more surface layers of materials on the substrate by chemical adsorption, without using a plasma.

In some embodiments, the method may further include repeating, while the substrate remains in the processing chamber, the modifying of one or more surface layers of material on the substrate by chemical adsorption and the removing the one or more modified surface layers on the substrate by desorption.

In some such embodiments, the method may further include purging the processing chamber between modifying and removing operations.

In some such embodiments, the method may further include heating, after the modifying, the substrate from the first temperature to the second temperature, and actively cooling, after the removing, the substrate from the second temperature to the first temperature.

In some other such embodiments, the heating may further include using at least radiant heating, convective heating, plasma heating, and the cooling may further include using at least convective cooling or laser cooling.

In some further such embodiments, the cooling may further include flowing a cooling gas onto the substrate.

In some other such embodiments, the heating may further include heating the substrate from a top direction, heating the substrate from a bottom direction, or heating the substrate from both the top and the bottom directions, and the cooling may further include cooling the substrate from the top direction, cooling the substrate from the bottom direction, or cooling the substrate from both the top and the bottom directions.

In some such embodiments, the heating may further include heating the substrate to the second temperature in about 250 milliseconds or less, and the cooling may further include actively cooling the substrate to the first temperature in about 250 milliseconds or less.

In some embodiments, the removing may further include heating the substrate in order to maintain the substrate temperature constant at the second temperature.

In some embodiments, the method may further include flowing, before or during the modifying, a first process gas onto the substrate; the substrate may be configured to modify the one or more surface layers of material on the substrate.

In some such embodiments, the first process gas may be a halogenating gas or an oxidizing gas.

In some embodiments, the method may further include converting, after the modifying and before, or during, the removing, the one or more modified surface layers on the substrate to a converted layer. The removing may further include removing the converted layer on the substrate by desorption, without using a plasma, while the substrate is maintained at the second temperature.

In some such embodiments, the converting may further include flowing a second process gas onto the substrate; the second process gas may be configured to convert the one or more modified surface layers on the substrate to the converted layer.

In some embodiments, the method may further include generating, not during the modifying and the removing, a plasma in the processing chamber and cleaning a surface of the processing chamber, a surface of the substrate, or both.

In some such embodiments, the generating may occur before the modifying, after the removing, or before the modifying and after the removing.

In some such embodiments, the removing may further include desorbing 90% or more of the modified layer from the substrate.

In some such embodiments, the modifying may further include maintaining the substrate at the first temperature for about 1 second to about 5 seconds, and the removing may further include maintaining the substrate at the second temperature for about 1 second to about 5 seconds. In some embodiments, an apparatus for semiconductor processing may be provided. The apparatus may include a processing chamber that includes chamber walls that at least partially bound a chamber interior, and substrate positioning features configured to support and thermally float a substrate in the chamber interior, a process gas unit configured to flow a first process gas into the chamber interior and onto the substrate in the chamber interior, a substrate heating unit configured to heat the substrate in the chamber interior, a substrate cooling unit configured to actively cool the substrate in the chamber interior, and a controller with instructions that are configured to (a) cause the substrate heating unit to heat a substrate positioned on the substrate positioning features to a first temperature, (b) cause the process gas unit to flow the first process gas to the substrate in the chamber interior, the first process gas may be configured to modify one or more surface layers of material on the substrate by chemical adsorption without using a plasma while the substrate is maintained at the first temperature, and (c) cause the substrate heating unit to maintain the substrate at a second temperature, the one or more modified surface layers on the substrate may be removed by desorption without using a plasma while the substrate is maintained at the second temperature.

In some embodiments, the second temperature may be higher than the first temperature, and the controller may further include instructions that are configured to (d) cause, after (b), the substrate heating unit to heat the substrate to the second temperature.

In some such embodiments, the controller may further include instructions that are configured to (e) cause, after (d), the substrate cooling unit to actively cool the substrate to the first temperature, and (f) repeat, after (e), (a) through (e).

In some embodiments, the second temperature may be lower than the first temperature, and the controller may further include instructions that are configured to (g) cause, after (b), the substrate cooling unit to actively cool the substrate to the second temperature.

In some such embodiments, the controller may further include instructions that are configured to (h) repeat, after (g), (a) through (g).

In some embodiments, the first process gas may include an oxidizing gas or a halogenating gas.

In some embodiments, the substrate heating unit may be configured to heat the substrate from a bottom direction, heat the substrate from a top direction, or heat the substrate from both the top and the bottom directions, and the substrate cooling unit may be configured to cool the substrate from a bottom direction, cool the substrate from a top direction, or cool the substrate from both the top and the bottom directions.

In some embodiments, the substrate heating unit includes at least one or more lamps, one or more gradient-index ("GRIN") lenses connected to a light source, a laser, a convective heating unit, or a plasma heating unit.

In some such embodiments, the processing chamber may further include a window that partially bounds the chamber interior and is configured to allow radiation to be transmitted into the chamber interior, the substrate heating unit may be positioned outside the chamber interior such that at least a portion of the window is interposed between the chamber interior and the substrate heating unit, the substrate heating unit may include at least one or more lamps, one or more GRIN lenses connected to a light source, a laser, and the substrate heating unit may be configured to emit radiation through the window and into the chamber interior to heat a substrate in the chamber interior. In some other embodiments, there may be no window interposed between the chamber interior and the one or more GRIN lenses such that a portion of each GRIN lens is in the chamber interior.

In some further embodiments, the apparatus may further include a plasma generator configured to generate a plasma in the chamber interior. The plasma generator may be a capacitively coupled plasma, an inductively coupled plasma, an upper remote plasma, or a lower remote plasma.

In some further such embodiments, the plasma generator may be a capacitively coupled plasma, an RF electrode of the plasma generator may be comprised of a metal or a doped silicon, and the substrate heating unit may include a plurality of GRIN lenses that are positioned within the RF electrode or the ground plate.

In some further such embodiments, the plasma generator may be a capacitively coupled plasma, an RF electrode of the plasma generator may include the window, and the substrate heating unit may include at least one or more lamps, one or more GRIN lenses connected to a light source, or a laser.

In some further additional embodiments, the window may be a transparent indium tin oxide ("ITO") window that is grounded or powered.

In some further such embodiments, the plasma generator may be an inductively coupled plasma, an antenna of the plasma generator may be positioned outside the chamber interior, the substrate heating unit may include a plurality of GRIN lenses that are positioned within the window, and the window may be interposed between the antenna and the chamber interior.

In some further such embodiments, the plasma generator may be an upper remote plasma configured to flow a plasma into the chamber interior, and the substrate heating unit may include a plurality of GRIN lenses that are positioned within the window.

In some further such embodiments, the plasma generator may be a lower remote plasma that includes an antenna vertically interposed between the substrate positioning features and a bottom of the chamber interior, and the substrate heating unit may include one or more lamps, one or more GRIN lenses connected to a light source, or a laser.

In some such embodiments, the substrate heating unit may include a plurality of lamps that are positioned inside the chamber interior.

In some embodiments, the substrate cooling unit may include at least a cooling fluid supply configured to cool a cooling fluid to 0° C. or less and flow the cooling fluid into the chamber interior and onto the substrate, and a laser.

In some such embodiments, the apparatus may further include one or more nozzles fluidically connected to the cooling fluid supply and the one or more nozzles may be configured to flow the cooling fluid into the chamber interior.

In some embodiments, the processing chamber may not include a pedestal.

DETAILED DESCRIPTION

Figure 1:
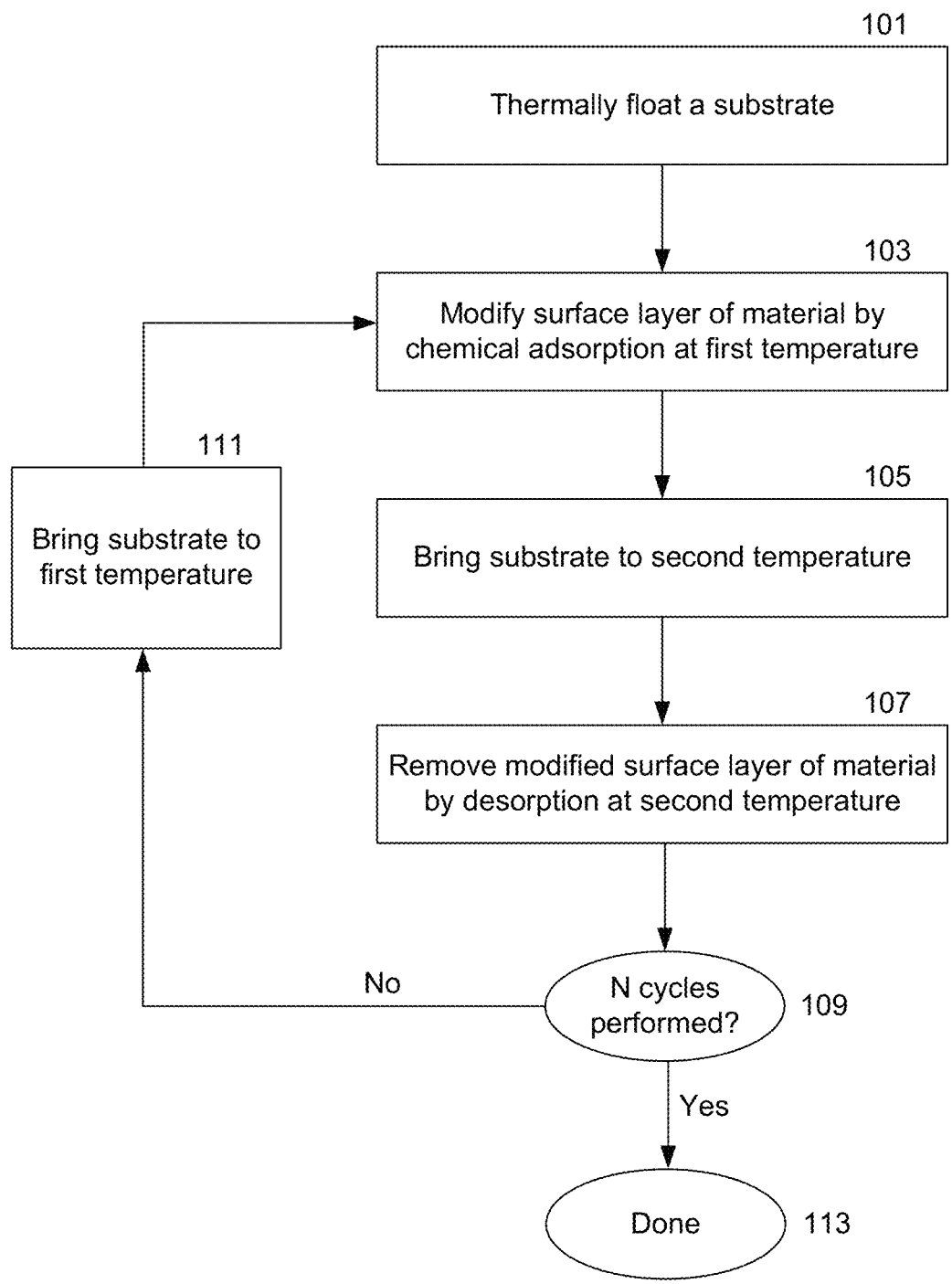
FIG. 1 depicts an example process flow diagram for performing operations in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Conventional ALE Processing

Semiconductor fabrication processes often involve patterning and etching of various materials, including conductors, semiconductors, and dielectrics. Some examples include conductors, such as metals or carbon; semiconductors, such as silicon or germanium; and dielectrics, such as silicon oxide, aluminum dioxide, zirconium dioxide, hafnium dioxide, silicon nitride, and titanium nitride. Atomic layer etching ("ALE") processes remove thin layers of material using sequential self-limiting reactions. Generally, an ALE cycle is the minimum set of operations used to perform an etch process one time, such as etching a monolayer. The result of one ALE cycle is that at least some of a film layer on a substrate surface is etched. Typically, an ALE cycle includes a modification operation to form a reactive layer, followed by a removal operation to remove or etch only this reactive layer. The cycle may include certain ancillary operations such as removing one of the reactants or byproducts. Generally, a cycle contains one instance of a unique sequence of operations.

As an example, a conventional ALE cycle may include the following operations: (i) delivery of a reactant gas, (ii) purging of the reactant gas from the chamber, (iii) delivery of a removal gas and an optional plasma, and (iv) purging of the chamber. In some embodiments, etching may be performed nonconformally. The modification operation generally forms a thin, reactive surface layer with a thickness less than the un-modified material. In an example modification operation, a substrate may be chlorinated by introducing chlorine into the chamber. Chlorine is used as an example etchant species or etching gas, but it will be understood that a different etching gas may be introduced into the chamber. The etching gas may be selected depending on the type and chemistry of the substrate to be etched. A plasma may be ignited and chlorine reacts with the substrate for the etching process; the chlorine may react with the substrate or may be adsorbed onto the surface of the substrate. The species generated from a chlorine plasma can be generated directly by forming a plasma in the process chamber housing the substrate or they can be generated remotely in a process chamber that does not house the substrate, and can be supplied into the process chamber housing the substrate.

In some instances, a purge may be performed after a modification operation. In a purge operation, non-surface-bound active chlorine species may be removed from the process chamber. This can be done by purging and/or evacuating the process chamber to remove the active species, without removing the adsorbed layer. The species generated in a chlorine plasma can be removed by simply stopping the plasma and allowing the remaining species decay, optionally combined with purging and/or evacuation of the chamber. Purging can be done using any inert gas such as N2, Ar, Ne, He and their combinations.

In a removal operation, the substrate may be exposed to an energy source to etch the substrate by directional sputtering (this may include activating or sputtering gas or chemically reactive species that induce removal). In some embodiments, the removal operation may be performed by ion bombardment using argon or helium ions. During removal, a bias may be optionally turned on to facilitate directional sputtering. In some embodiments, ALE may be isotropic; in some other embodiments ALE is not isotropic when ions are used in the removal process.

In various examples, the modification and removal operations may be repeated in cycles, such as about 1 to about 30 cycles, or about 1 to about 20 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate. In some embodiments, each ALE cycle may etch at least about 0.1 Å, 0.5 Å, or 1 Å.

In some instances, prior to etching, the substrate may include a blanket layer of material, such as silicon or germanium. The substrate may include a patterned mask layer previously deposited and patterned on the substrate. For example, a mask layer may be deposited and patterned on a substrate including a blanket amorphous silicon layer. The layers on the substrate may also be patterned. Substrates may have "features" such as via or contact holes, which may be characterized by one or more of narrow and/or re-entrant openings, constrictions within the feature, and high aspect ratios. One example of a feature is a hole or via in a semiconductor substrate or a layer on the substrate. Another example is a trench in a substrate or layer. In various instances, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

The use of plasma during conventional etching presents numerous challenges and disadvantages. For instance, it is generally desirable to create the same plasma conditions for each ALE cycle of a single substrate as well as for all substrates in a batch, but it can be difficult to repeatedly recreate the same plasma conditions due to some plasmas changing due to accumulation of material in the process chamber. Additionally, many conventional ALE processes may cause damage to exposed components of the substrate, such as silicon oxide, may cause defects, and may increase the top-to-bottom ratio of a pattern and increase the pattern loading. Defects may lead to pattern-missing to the extent that the device may be rendered useless. Plasma-assisted ALE also utilizes small radicals, i.e., deeply dissociated radicals, that are more aggressive which causes them to remove more material than may be desired, thereby reducing the selectivity of this etching. As a result, conventional ALE techniques are often unsuitable for selectively etching some materials, such as aluminum dioxide, zirconium dioxide, hafnium dioxide, silicon nitride, and titanium nitride.

Thermal ALE Techniques

Provided herein are methods and apparatuses for performing ALE using different temperatures, rather than plasma, to drive adsorption during the modification operation and to drive desorption during the removal operation. In some embodiments, one or more layers of the substrate may be modified with chemical adsorption (hereinafter "chemisorption"), not with a plasma, while the substrate is at a first temperature, after which the one or more modified layers of the substrate may be removed with desorption, not with a plasma, while the substrate is at a second temperature. ALE that relies upon chemical reactions in conjunction with different temperatures, not a plasma, to drive chemical reactions in the modification and removal operations may be considered "thermal ALE". In some embodiments, this thermal ALE may be considered an isotropic etch.

FIG. 1 depicts an example process flow diagram for performing operations in accordance with disclosed embodiments. Each operation of FIG. 1 will be discussed in greater detail below, but in general, operation 103 represents the modification operation during which one or more surface layers of material on a substrate are modified using chemisorption, not a plasma, while the substrate is maintained at a first temperature, and operation 107 represents the removal operation during which the one or more modified surface layers of the substrate are removed using desorption, not a plasma, while the substrate is maintained at a second temperature that is different from the first temperature. A single cycle may include operations 103, 105, and 107, and in order to etch multiple layers of material from the substrate, multiple cycles may be performed.

Figure 8:
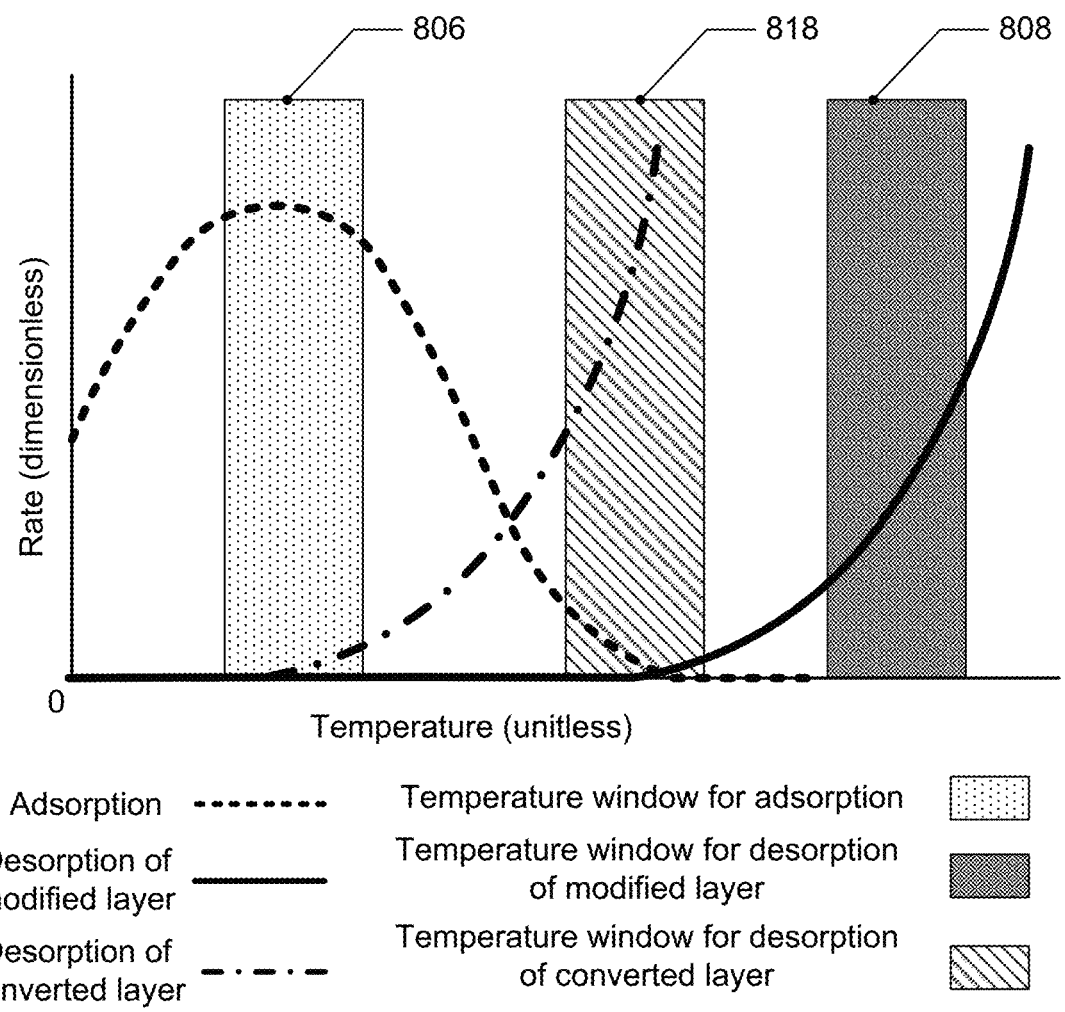
FIG. 8 depicts other example chemisorption and desorption curves.

Chemisorption and desorption are temperature dependent chemical reactions that may occur in separate temperature regimes, or may occur in partially overlapping temperature regimes as discussed in more detail below and illustrated in FIGS. 2, 3, and 8. Because of this, the thermal ALE techniques and apparatuses described herein modulate the temperature of the substrate between the modification and removal operations in order to enable and utilize chemisorption that occurs at one temperature for the modification operation, and to enable and utilize desorption that occurs at a different temperature for the removal operation.

Figure 2:
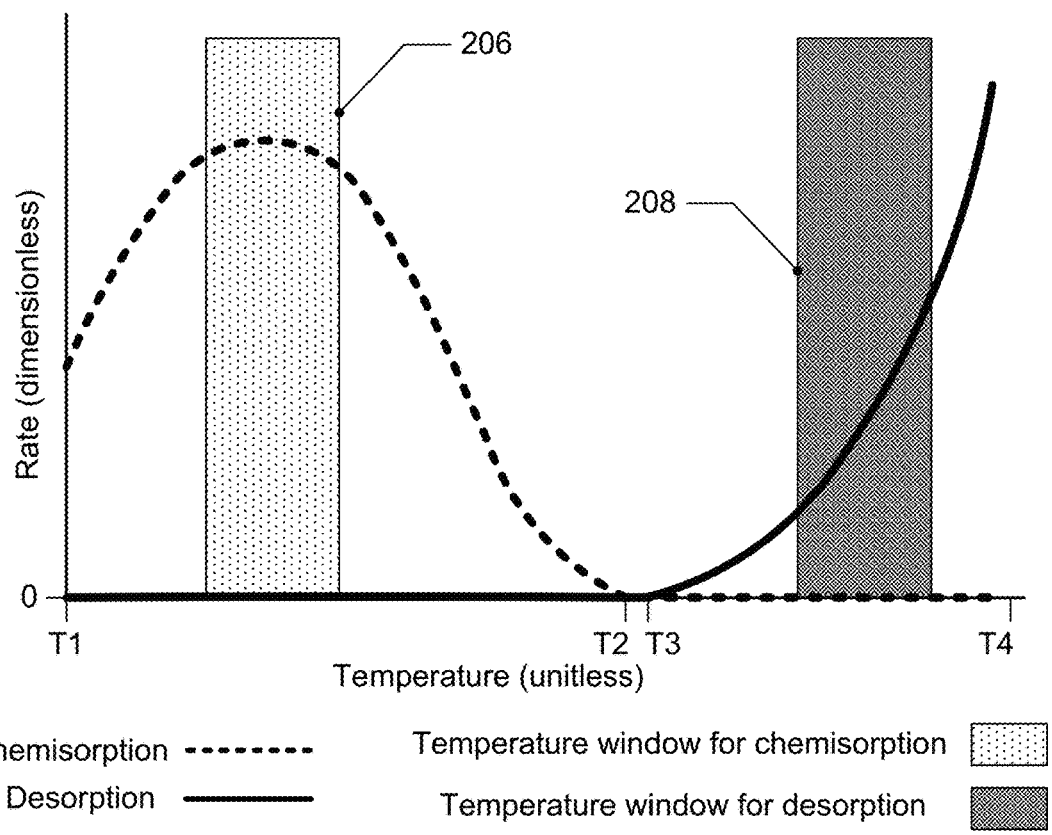
FIG. 2 depicts example chemisorption and desorption curves.

For example, FIG. 2 depicts example chemisorption and desorption curves. The horizontal axis is dimensionless temperature and the vertical axis is dimensionless rate (i.e., rate of chemisorption or desorption). As can be seen, in general this Figure illustrates that chemisorption and desorption may take place in two non-overlapping temperature ranges (first temperature range 206 and second temperature range 208) which creates a desire to swing the substrate temperature rapidly within each ALE cycle. In a more detailed explanation, FIG. 2 depicts that increasing the temperature causes the chemisorption (dotted line) rate to increase, then decrease to zero, while the increasing temperature causes the desorption (solid line) rate to remain at zero and then increase. For chemisorption, only a particular temperature range, such as that between temperature T1 and temperature T2, enables the activation barrier of the molecules in the layer of material and the incoming modifying molecules to be overcome which allows for dissociation and chemical bonding between these molecules and an adsorbate in the modifying molecule. As seen in FIG. 2, increasing the temperature past the highest chemisorption rate causes the chemisorption rate to decrease, due to suppression of physisorption which is a prerequisite step for chemisorption. For desorption, a different temperature range, such as between temperature T3 and T4, enables the activation barrier of the modified molecule to be overcome which allows for the release of the modified layer from the surface of the substrate. In this example, the temperature ranges at which chemisorption and desorption occur do not overlap. Accordingly, in order to remove a molecule from a substrate using chemisorption and desorption that occur in different temperature regimes, the modification operation 103 may occur in the first temperature range 206 and the removal operation 107 may occur in the second, higher temperature range 208. Performing multiple cycles to remove multiple layers of material includes repeatedly heating and cooling the substrate between the two temperature regimes for chemisorption and desorption.

In some other instances as noted above, the chemisorption and desorption temperature ranges may overlap. FIG. 3 depicts other example chemisorption and desorption curves. The axes and lines represent the same items as in FIG. 2, but as can be seen in FIG. 3, the chemisorption and desorption curves overlap in at least region 310. While ALE using chemisorption and desorption may occur at the same temperature region, such as region 310, these chemical reactions are not optimal during any overlapping region because both chemisorption and desorption rates are low, or one rate is high while the other is very low. Using the same overlapping temperature or temperature range for both chemisorption and desorption may increase the time required for performing both the modification and removal operations thereby decreasing throughput of processing substrates, and may also decrease the effectiveness of these reactions which may result in defects on the substrate. In order to remove a molecule from a substrate using chemisorption and desorption that have an overlapping temperature regime in a more efficient and timely manner than at a single temperature, the modification operation 103 may occur in the temperature range 306 and the removal operation 107 may occur in the higher temperature range 308 thereby allowing for increased throughput and reduced wafer defects by using higher chemisorption and desorption rates. In some embodiments, the increased throughput may be achieved if the times for the temperature increase and temperature decrease are together kept shorter than the time saved using higher reaction rates. Like above, performing multiple cycles to remove multiple layers of material includes repeatedly heating and cooling the substrate between the chemisorption and desorption temperature regimes.

Many conventional ALE techniques do not modulate the temperature of a substrate during and/or between each ALE cycle, and many conventional ALE apparatuses are not able to modulate the temperature of the substrate in order to adequately and efficiently perform thermal ALE. For instance, many conventional ALE techniques and apparatuses maintain the substrate at a constant temperature during all ALE operations and use plasma during the modification operation, the removal operation, or both, to overcome the energy barrier associated with the temperature dependence of chemisorption and desorption. Additionally, many typical ALE apparatuses may be able to heat a substrate to multiple temperatures, but may not able to heat the substrate in a quick manner that enables high throughput, may not be able to heat the substrate to the desired temperature ranges, may not be able to maintain the temperature of the substrate for the desired time and the desired temperature ranges, and similarly may not be able to cool the substrate fast enough to enable high throughput or cool the substrate to the desired temperature ranges. For instance, it is desirable to reduce the temperature ramp times as much as possible, such as less than about 250 milliseconds in some embodiments, but many conventional ALE apparatuses cannot heat, cool, or both, a substrate less than that time; it may take some apparatuses multiple seconds or minutes to cool and/or heat a substrate which slows throughput, especially in instances in which the chemisorption and desorption reactions, i.e., the modification and removal operations, respectively, may each take about 1 to 5 seconds. Additionally, most conventional ALE apparatuses cannot quickly heat and maintain the substrate temperature for the time necessary for chemisorption and desorption to complete.

Referring back to FIG. 1, the example process flow diagram depicted will now be discussed in more detail. As stated previously, in operation 103 one or more surface layers of material are modified by chemisorption while the substrate is maintained at a first temperature; this may result in the creation of one or more modified surface layers of the substrate. The substrate includes layers of material and exposed surfaces that may be a uniform layer of material or may be a non-uniform layer that includes different molecules and elements. A first process gas with modifying molecules may be flowed onto the substrate that is maintained at the first temperature. In some embodiments, the modifying molecules may include a halogen, such as fluorine, in order to halogenate exposed molecules on the substrate, while some embodiments may include oxygen in order to oxidize exposed molecules on the substrate. The first process gas may also include a carrier gas, such as $N_2$, Ar, He, and Ne. This first temperature allows for chemisorption between the modifying molecules and at least some of the molecules in the exposed surface(s) of material.

Figure 3:
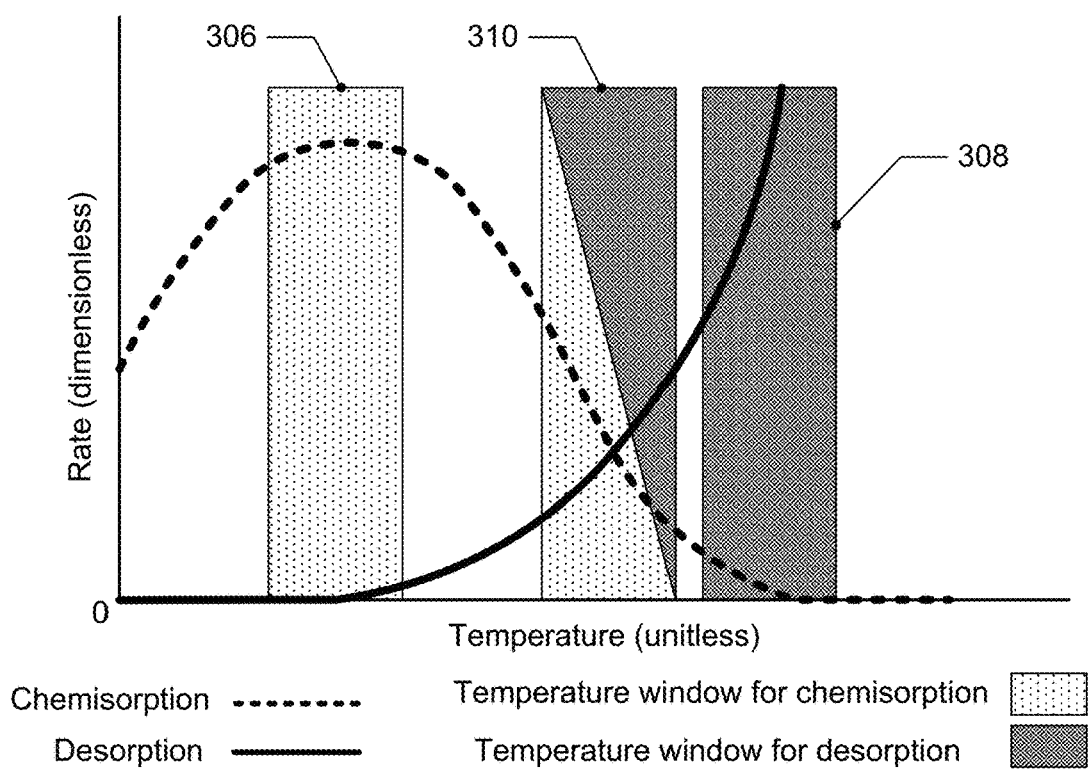
FIG. 3 depicts other example chemisorption and desorption curves.

Although the term "first temperature" is used, the temperatures discussed herein may be considered both a specific temperature, or may be a temperature range like highlighted in FIGS. 2 and 3. In some embodiments, the first temperature may be between about 20° C. and 150° C., about 20° C. and 100° C., and about 20° C. and 80° C., for example. Additionally, the substrate may be maintained at the temperature during all, or substantially all (e.g., at least 80%, 90%, or 95%), of the modification operation. The duration of the modification operation may be the duration for which modification of substantially all (e.g., at least 80%, 90%, or 95%) of desired exposed molecules on the substrate occurs. This may range from about 0.5 seconds to about 10 seconds, 0.5 seconds to about 5 seconds, or about 1 second to about 5 seconds, for example.

In operation 105, the temperature of the substrate is brought to a second temperature. This second temperature may be the temperature at which desorption occurs for the one or more modified surface layers, like illustrated in FIGS. 2 and 3. In some embodiments, the second temperature may be greater than the first temperature, and in these embodiments, operation 105 may include heating the substrate from the first temperature to the second temperature. In some other embodiments, the second temperature may be less than the first temperature, and in these embodiments, operation 105 may include actively cooling the substrate from the first temperature to the second temperature. As described below, the substrate may be heated using radiant heating, convection heating, solid-to-solid heat transfer, or with a plasma. Additionally, the substrate top, bottom, or both, may be heated. The heating of the substrate may also occur in a non-linear fashion, in some embodiments, as discussed further below. As also described below, the substrate may be actively cooled in various manners.

In operation 107, the one or more modified surface layers may be removed while the substrate is maintained at the second temperature. In some embodiments, the second temperature alone may enable and cause desorption of the modified molecules from the substrate thereby removing the modified molecules from the substrate. In some other embodiments, a second process gas with removal molecules may be flowed onto the substrate, including onto the exposed surfaces of the substrate. The second process gas may also include a carrier gas as described above. These removal molecules may react with the modified molecules to form a different volatile molecule, which may be considered a converted molecule. This converted molecule may in turn be removed from the substrate by desorption when the substrate is at the second temperature. In some embodiments, this flowing of the second process gas may be part of the removal operation 107 or may be a separate operation, as discussed below, that occurs before, after, or during the heating of the substrate.

In some embodiments, the second temperature may be between about 200° C. and 600° C., about 200° C. and 500° C., about 200° C. and 350° C., or about 350° C. and 500° C., for example. Additionally, the substrate may be maintained at the temperature during all, or substantially all (e.g., at least 80%, 90%, or 95%), of the removal operation. The duration of the removal operation may be the duration for which desorption of substantially all (e.g., at least 80%, 90%, or 95%) of desired molecules on the substrate occurs. This may range from about 0.5 seconds to about 10 seconds, about 0.5 seconds to about 5 seconds, or about 1 second to about 5 seconds.

Figure 4:
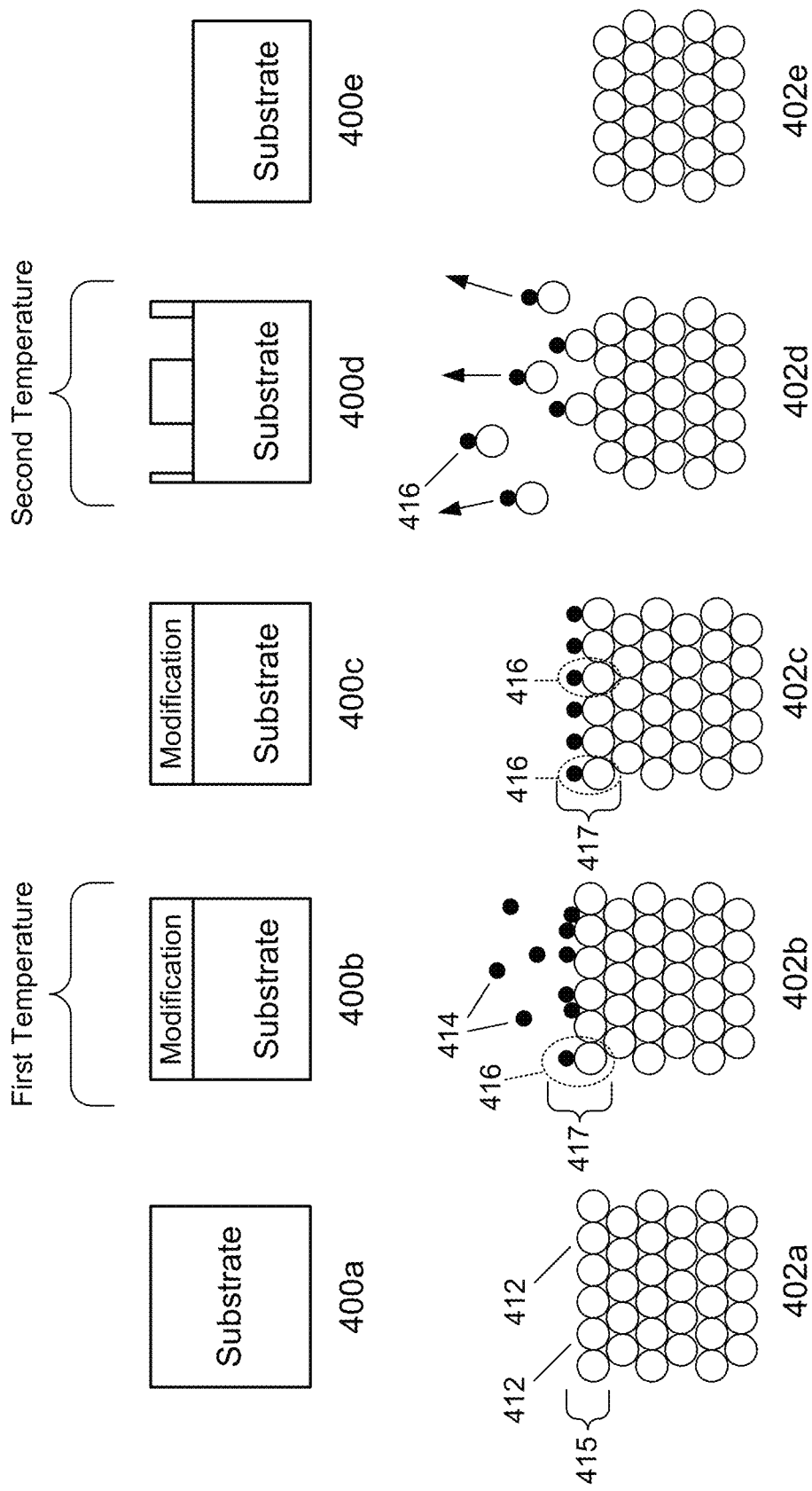
FIG. 4 depicts an example schematic illustration of a thermal ALE cycle.

FIG. 4 depicts an example schematic illustration of a thermal ALE cycle. Diagrams 400a-400e show a thermal ALE cycle. In 400a, the substrate is provided. In 400b, the surface of the substrate is modified. In 400c, the next operation is prepared; this preparation may include flowing a second process gas, purging the chamber, or bringing the substrate to the second temperature. In 400d, the substrate is maintained at a second temperature so the modified layer desorbs, thereby etching the substrate. In 400e, the desired material has been removed. Similarly, diagrams 402a-402e show an example of a thermal ALE cycle for etching molecules 412 from a layer of material. In 402a, a substrate is provided, which includes a plurality of molecules, some of which are identified as item 412. The top layer in 402a may be considered a surface layer 415 of material; as seen in 402a, the surface layer of material includes six molecules 412, two of which are identified. In 402b, a first process gas with modifying molecules 414 (the solid black circles, some of which are identified with identifier 414) is introduced to the substrate which modifies the surface layer 415 of the substrate, using chemisorption and not a plasma. The schematic in 402b shows that some of the modifying molecules 414 are adsorbed onto the molecules 412 of the surface layer 415 of the substrate thereby creating modified surface layer 417 that includes modified molecules 416 (one modified molecule 416 is identified inside a dotted ellipse in 402b). In 402c, after the modified molecules 416 and the modified surface layer 417 have been created in 402b, the first processing gas may be optionally purged from the chamber. Here, six modified molecules 416 are seen in the modified surface layer 417, two of which are identified inside dotted ellipses, and the modifying molecules 414 have been removed. In 402d, the temperature of the substrate has been changed to the second temperature where desorption of the modified molecules 416 of the modified surface layer 417 from the substrate occurs; no plasma is utilized in this removal operation. In 702e, the modified molecules 416, and therefore the modified surface layer 417, have been removed from the substrate. Although a single layer of material was removed in FIG. 4, it is understood that one or more surface layers of material may be removed by such operations.

Again referring back to FIG. 1, after the removal operation 107 is performed, the query may be made as to whether the desired number of ALE cycles has been performed. If additional cycles are desired to remove additional layers of material, including surface layers of material, then operations 103, 105, 107, and 111 may be repeated. In order to perform another modification operation 103 at the first temperature after the removal operation 107 at the second temperature, the temperature of the substrate is changed to the first temperature as indicated by operation 111. In some embodiments in which the first temperature is less than the second temperature, operation 111 may include active cooling of the substrate which is performed in order to cool the substrate in a timely and efficient manner. A substrate at the second temperature, which may range between about 200° C. and 500° C., for example, may take numerous seconds or minutes to cool from a temperature in this range down to the first temperature, which may be between about 20° C. and 100° C. This time delay may decrease throughput which is not desirable for high-volume semiconductor processing. As described in more detail below, the top, bottom, or both, of the substrate may be actively cooled and such active cooling may be accomplished by flowing a fluid onto the substrate or through the use of a cooling laser. Active cooling is able to cool the substrate from the second temperature to the first temperature range in less or equal to about 250 milliseconds, 150 milliseconds, or 100 milliseconds, for instance. Once the desired number of cycles is performed, the thermal ALE finishes in operation 113. As stated above, in some embodiments, the first temperature may be greater than the second temperature and in these embodiments, operation 111 includes heating the substrate from the second temperature to the first temperature. This heating is performed as described herein.

Figure 5A:
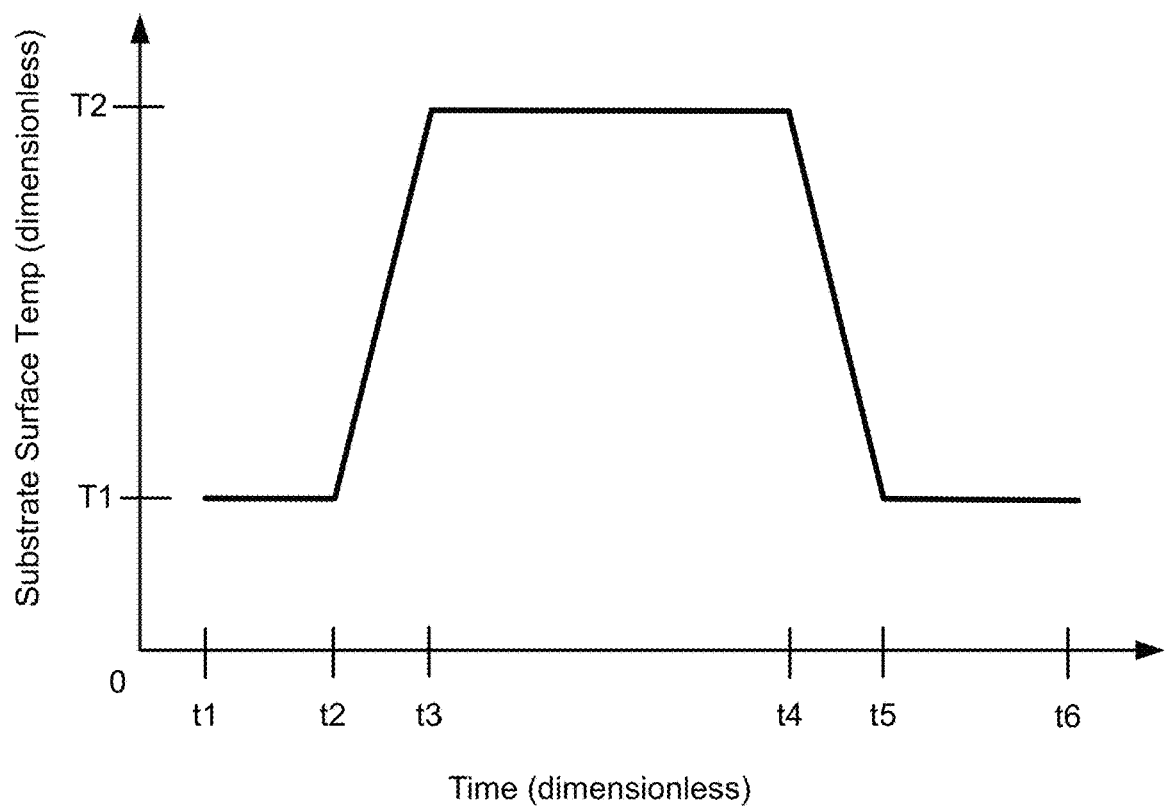
FIG. 5A depicts a substrate surface temperature profile and FIG. 5B depicts example heating and cooling profiles of the substrate.
Figure 5B:
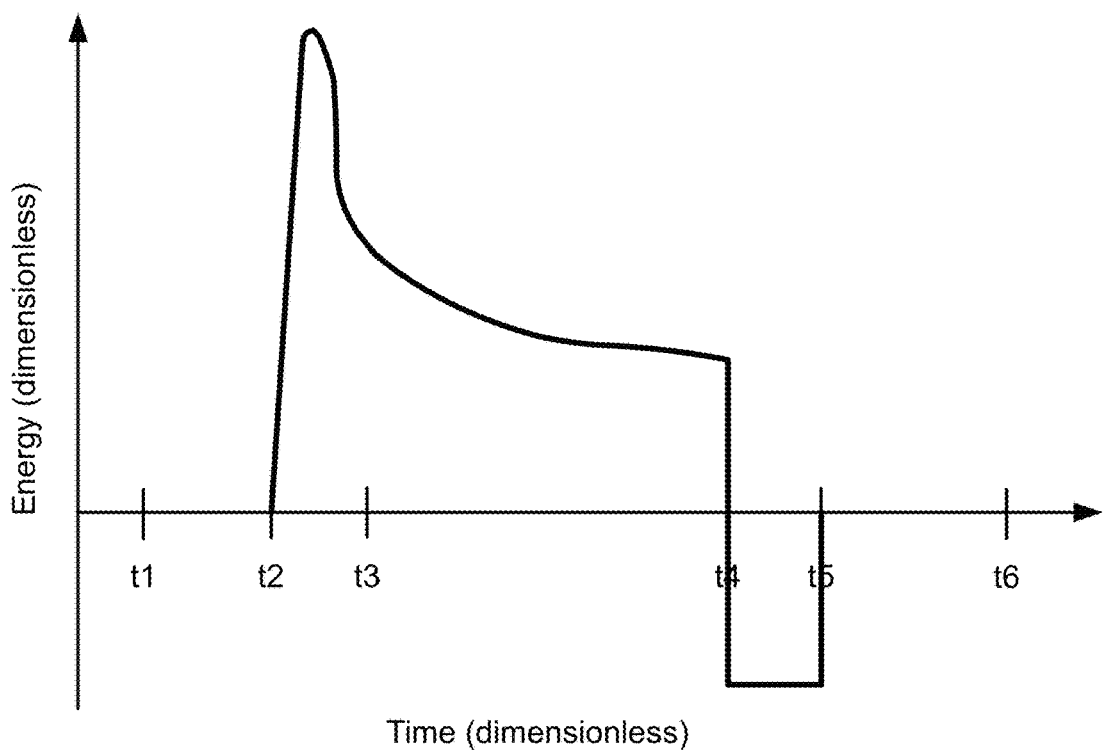

In order to rapidly heat the substrate, such as in less than or equal to about 250 milliseconds or 100 milliseconds, energy may be applied to the substrate in a non-linear fashion. FIG. 5A depicts a substrate surface temperature profile and FIG. 5B depicts example heating and cooling profiles of the substrate. These two graphs of FIGS. 5A and 5B reflect the temperature of and energy delivered to the same substrate over the same time. The time period between time t1 and time t2 may be considered the first temperature T1 of the modification operation. At time t2, energy is applied to the substrate in order to heat it to the higher second temperature T2, which is reached at time t3 as seen in FIG. 5A (which may be considered operation 105). Between time t3 and time t4, the temperature of the substrate remains constant at temperature T2. As see in FIG. 5B, the heating energy applied to the substrate in the manner depicted between times t2 and t3 causes the substrate to reach the second temperature T2; the heating energy applied to the substrate in the non-linear manner depicted between times t3 and t4 causes the substrate to remain at the second temperature T2 during this period. In order to actively cool the substrate down from the second temperature T2 to the first temperature T1 between times t4 and t5 (which may be considered operation 111), a linear application of cooling may be applied to the substrate, such as a cooling gas flowing on the substrate at a constant temperature as seen in FIG. 5B. In some embodiments, the time between t2 and t3, and between t4 and t5, may be less than or equal to 250 milliseconds, 150 milliseconds, or 100 milliseconds. This example application of heating and cooling energy may be repeated for each cycle of thermal ALE.

In some embodiments, the substrate is thermally floated in the chamber during thermal ALE operations as identified in operation 101 of FIG. 1. Some embodiments of thermal ALE include heating and cooling the substrate between at least two different temperatures and maintaining the substrate temperature at least the two different temperatures. This heating and cooling of the substrate is directed at the thermal mass of just the substrate, but the total thermal mass of the substrate that gets heated and cooled includes not only the thermal mass of the substrate itself, but the thermal masses of other items with which it is in thermal contact. For instance, if the substrate is in thermal contact with a large body, such as a pedestal or electrostatic chuck like in many conventional ALE apparatuses, this body acts as a heat sink for the substrate which affects the ability to accurately control the substrate temperature and reduces the quickness of substrate heating and cooling. Accordingly, it is desirable to position the substrate so that the smallest thermal mass is heated and cooled; the ideal smallest thermal mass being just the substrate itself. This thermal floating may therefore position the substrate so that it has minimal thermal contact (which includes direct and radiation) with other bodies in the chamber. As discussed in more detail below, this may include, for instance, positioning the outer circumference of the substrate on support pins or a support ring.

Figure 6:
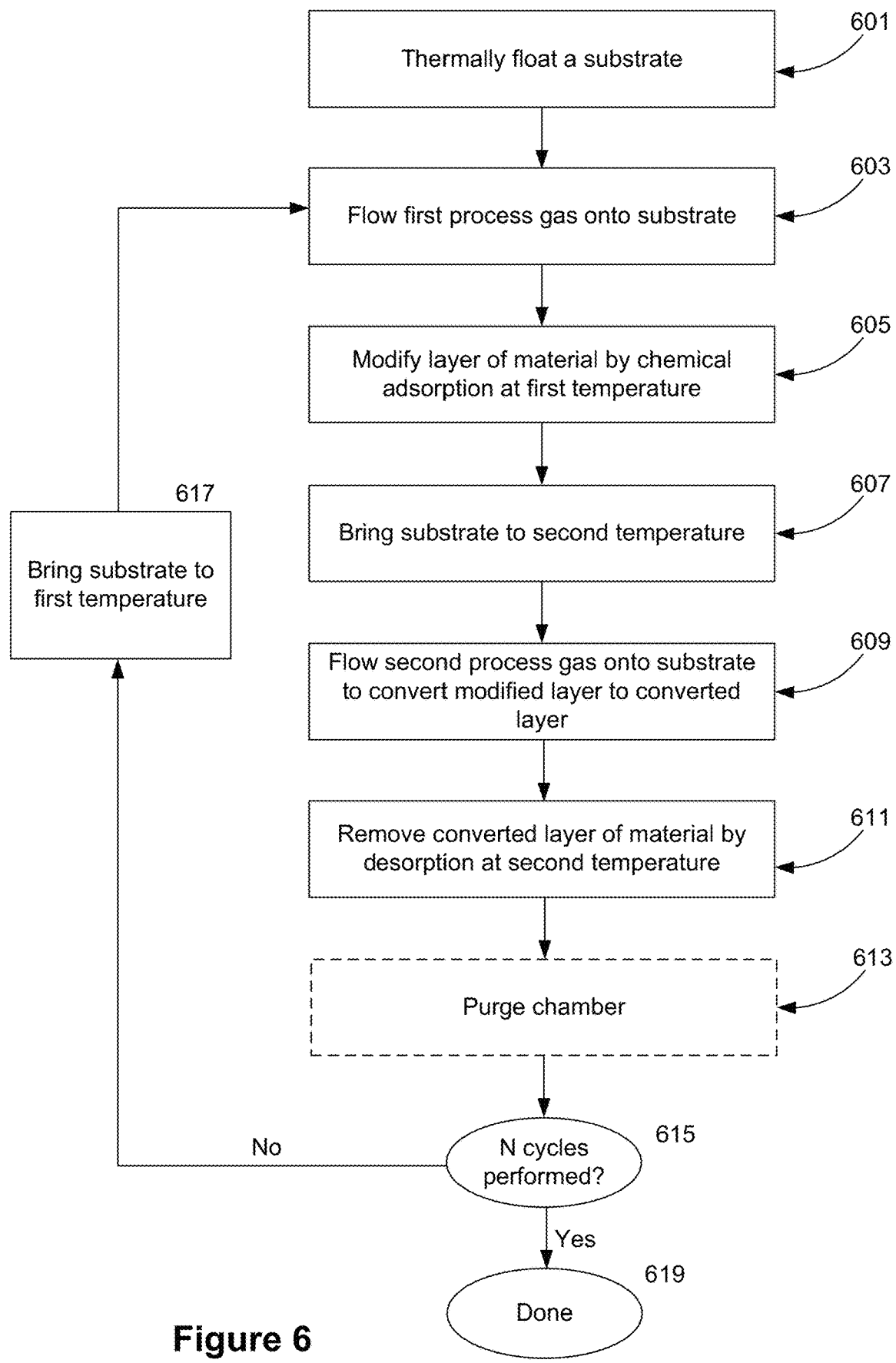
FIG. 6 depicts a second example process flow diagram for performing operations in accordance with disclosed embodiments.

As noted above, in some embodiments after the modification operation, the second process gas may be flowed onto the substrate to convert the modified surface layer to a converted layer and the removal operation involves desorption of the converted layer of material. FIG. 6 depicts a second example process flow diagram for performing operations in accordance with disclosed embodiments. The flow diagram of FIG. 6 is similar to that of FIG. 1, with noted differences discussed herein. For instance, operations 601, 605, 607, 615, 617, and 619 are the same as operations 101, 103, 105, 107, 109, 111, and 113, respectively, discussed above. However, in operation 603, a first process gas with a modifying molecule is flowed onto the substrate as described above. Although depicted as a separate operation in FIG. 6, operation 603 may be considered part of operation 605 in some embodiments. In operation 609, a second process gas with converting molecules is flowed onto the substrate. The converting molecules are configured to react with the modified molecules and created converted molecules in a converted layer of material on the substrate. These converted molecules are volatile molecules that may be desorbed, and therefore removed, from the substrate at the second temperature. Operation 613, which may be optional, indicates that the chamber may be purged after operation 611; this purge operation may also occur between any other two operations, such as between operation 605 and 607. One cycle may be represented by the performance of operations 603, 605, 607, 609, and 611 and in order to perform multiple cycles, operation 617 is performed so that the substrate may be brought from the second temperature to the first temperature. Accordingly, operations 603 to 617 may be repeated until the desired number of cycles has been performed. As also mentioned above, in those embodiments in which the first temperature is less than the second temperature, operation 607 includes heating the substrate and operation 617 includes actively cooling the substrate. In those other embodiments in which the first temperature is greater than the second temperature, operation 607 includes actively cooling the substrate and operation 617 includes heating the substrate.

Figure 7:
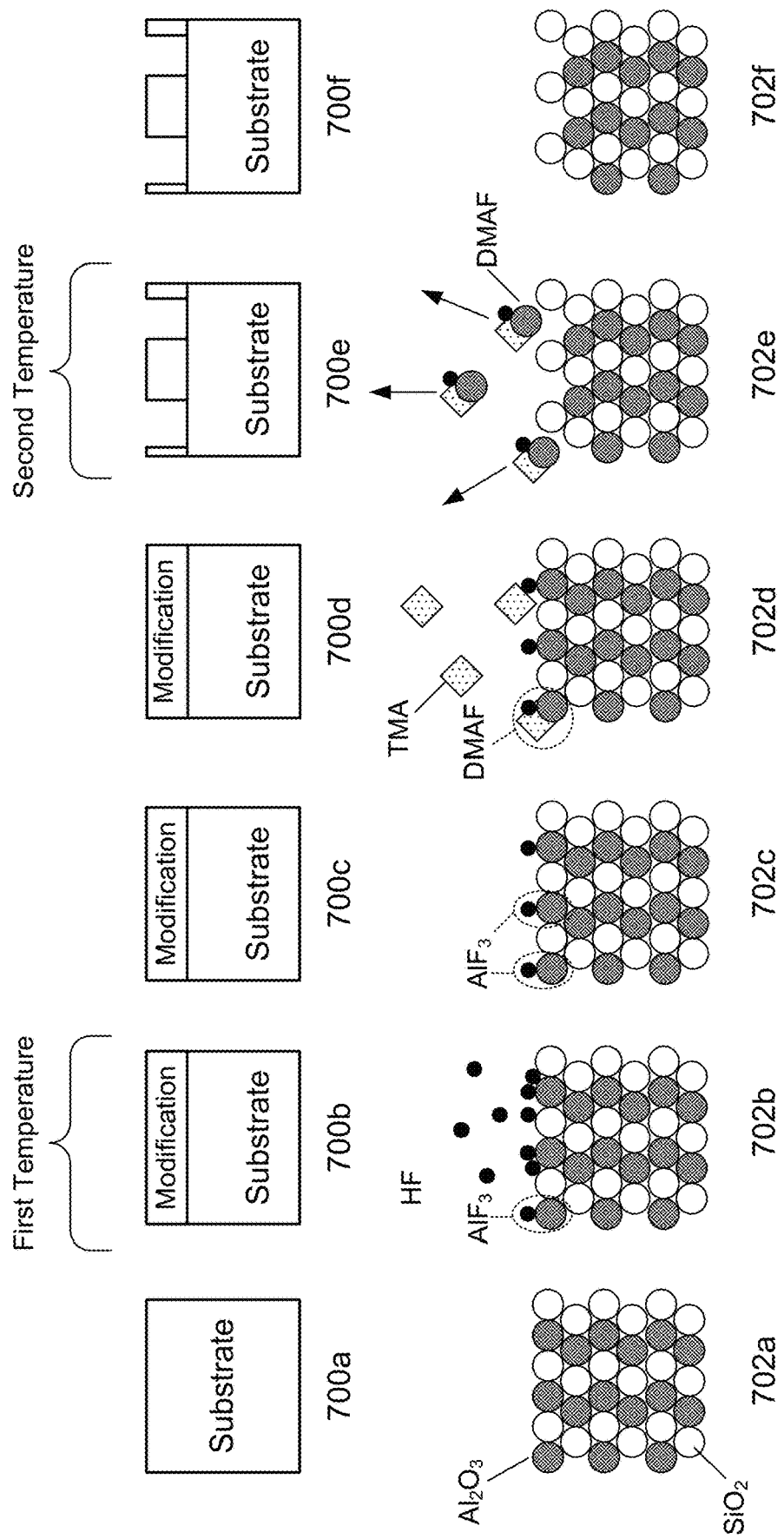
FIG. 7 depicts an example schematic illustration of another thermal ALE cycle, like that shown in FIG. 6.

FIG. 7 depicts an example schematic illustration of another thermal ALE cycle, like that shown in FIG. 6. Diagrams 700a-700f show a thermal ALE cycle. In 700a, the substrate is provided. In 700b, one or more surface layers of the substrate are modified while the substrate is maintained at the first temperature. In 700c, the next step may be prepared; for example, similar to above, this preparation may include flowing a process gas, purging the chamber, or bringing the substrate to the second temperature. In 700d, a second process gas is added to further modify the already modified surface layers. In 700e, the modified layer is being etched while the substrate is maintained at the second temperature. In 700f, the desired material has been removed. Similarly, diagrams 702a-702f show an example of a thermal ALE cycle for etching aluminum oxide from a layer of material. In 702a, a substrate is provided, which includes aluminum oxide ($Al_2O_3$) and silicon dioxide ($SiO_2$) molecules. One surface layer of the substrate includes both $Al_2O_3$ and $SiO_2$. In 702b, reactant hydrogen fluoride is introduced to the substrate which modifies a part of the surface layer of material of the substrate through chemisorption, not with a plasma, while the substrate is maintained at the first temperature, such as between about 20° C. and 100° C. The schematic in 702b shows that some fluorine is adsorbed onto the aluminum surface of the substrate to form aluminum fluoride ($AlF_3$), one of which is identified within a dashed ellipse (it includes a shaded $Al_2O_3$ and solid black circle HF). In 702c, after the aluminum fluoride has been formed, the reactant hydrogen fluoride gas may be optionally purged from the chamber. In 702d, a second process gas that includes trimethylaluminum (TMA; $Al(CH_3)_3$) is flowed onto the substrate; this TMA reacts with the aluminum fluoride to form dimethylaluminum fluoride ($Al_2Me_4F_2$; shown as a grouping of the diamond, shaded circle, and solid circle, one of which is identified in a dotted ellipse labeled DMAF) which is volatile. This may be considered an exchange of ligands between a metal on a surface of the substrate and a metal in the second process gas. This second process gas may be considered a removal gas. In 700e, the temperature of the substrate has been changed to the second temperature where desorption of the dimethylaluminum fluoride, not the silicon dioxide, from the substrate occurs; this is equivalent to etching of the substrate. In 702f, the chamber is purged and the byproducts are removed. This example results in the selective etching of the aluminum oxide from the substrate because the modifying and removing gases were selected to react with and remove the aluminum oxide, not the silicon dioxide, from the layer of material on the substrate.

In another similar example, the surface of the substrate may be modified in a similar manner to 702b, but the second process gas may include organic compounds that bind directly to a material on the surface of the substrate to create the converted layer. For instance, the organic compound may be an acidic acid or a formic acid, such as HCOOH, that may bind with the modified layer and that may be desorbed from the substrate at the second temperature.

There are numerous advantages to using a second process gas to convert the modified layer into a converted layer and to desorb the converted layer. For example, some desorption of some modified molecules may not be self-limiting which may cause more etching than is desired. Additionally, desorption of the converted layer may occur at more advantageous temperatures, such as a lower temperature than desorption of the modified layer thereby reducing heating and cool time. FIG. 8 depicts other example chemisorption and desorption curves. Like FIGS. 2 and 3, the horizontal axis is dimensionless temperature and the vertical axis is dimensionless rate (i.e., rate of chemisorption or desorption). Here, the dotted adsorption and solid desorption curves, and regions 806 and 808 are the same as 206 and 208 of FIG. 2. Here, the dash-dot-dash line indicates desorption of a converted layer of material and region 818 indicates the temperature regime for desorption of the converted layer. As can be seen, the temperature windows 806 and 818 are closer to each other than regions 806 and 808, thereby requiring less heating and cooling between these two windows than between regions 806 and 808.

The techniques and apparatuses described herein are able to selectively etch one or more layers of various materials. For instance, metals and metal oxides may be etched, including aluminum dioxide, zirconium dioxide, hafnium dioxide, as well as other materials, like silicon nitride and titanium nitride, for instance. As described above, the modifying molecules are selected to chemisorb, without using a plasma, with the molecules of the material that are to be ultimately removed from the substrate and not to chemisorb with other materials that are intended to remain on the substrate. Similarly, in some of the embodiments that use a second process gas that reacts with the modified molecules on the substrate and thereby enable desorption, i.e., a removal gas, the removal molecules may be selected to react with and cause the removal of the molecules of the material that are to be removed from the substrate and not with the other materials that are intended to remain on the substrate. For instance, Table 1 below sets forth example modification and removal molecules that may etch, or remove, the indicated molecules from the substrate while not causing the etching of the listed molecules. For example, a modification molecule of hydrogen fluoride and a removal molecule of tin acetylacetonate ($SN(acac)_2$) enables the removal of aluminum dioxide ($Al_2O_3$), zirconium dioxide ($ZrO_2$), and hafnium dioxide ($HfO_2$) without causing the removal of silicon dioxide ($SiO_2$), silicon nitride (SiN), and titanium dioxide (TiN). The examples of Table 1 are non-limiting illustrations.

TABLE 1

| Modification Molecule | Removal Molecule | Etching (Molecule Removed) | No Etching (Molecule Remains) |
|---|---|---|---|
| HF | $Sn(acac)_2$ | $Al_2O_3$ | $SiO_2$ |
|  |  | $ZrO_2$ | SiN |
|  |  | $HfO_2$ | TiN |
|  | $Al(CH_3)_3$ (TMA) | $Al_2O_3$ | $SiO_2$ |
|  |  | $HfO_2$ | SiN |
|  |  |  | TiN |
|  |  |  | $ZrO_2$ |
|  | $Al(CH_3)_2Cl$ (DMAC) | $ZrO_2$ | $SiO_2$ |
|  |  | $HfO_2$ | SiN |
|  |  | $Al_2O_3$ | TiN |
|  | $SiCl_4$ | $ZrO_2$ | $SiO_2$ |
|  |  | $HfO_2$ | SiN |
|  |  |  | TiN |
|  |  |  | $Al_2O_3$ |

In some embodiments, a plasma may be generated in order to clean the processing chamber or the substrate, which is not performed during either the modification or removal operations. Some thermal ALE operations may create a byproduct or residue on the substrate or on the inside of the chamber, such as on a window through which radiation heat travels to heat the substrate, which may be cleaned between cycles of the same substrate, at the end of processing a substrate, or between processing of substrates in a batch of substrates. This plasma cleaning may remove the byproduct or residues.

Thermal ALE Apparatuses

Figure 9:
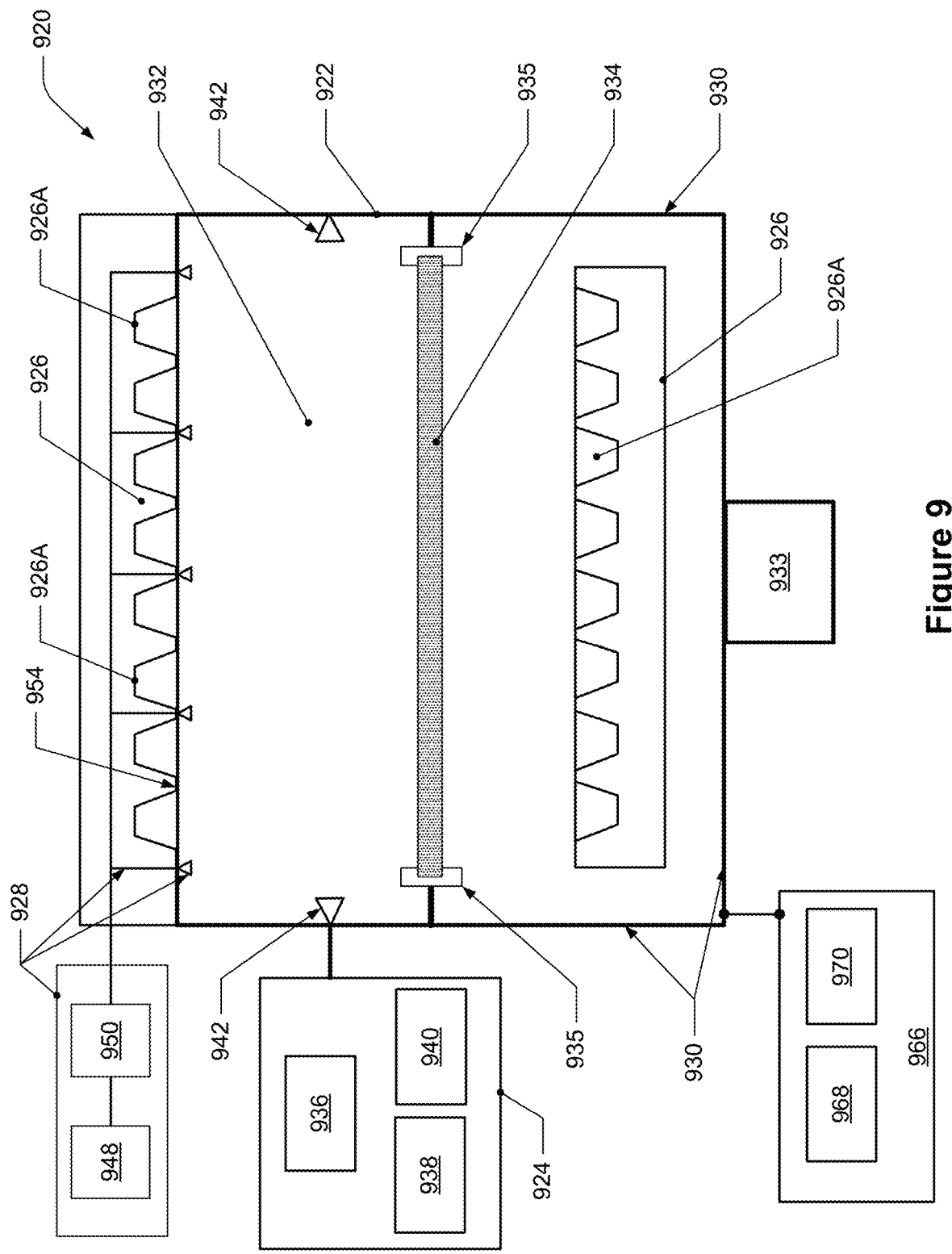
FIG. 9 depicts an example apparatus for semiconductor processing in accordance with disclosed embodiments.

Various embodiments of apparatuses capable of performing thermal ALE operations and techniques described above will now be described. FIG. 9 depicts an example apparatus for semiconductor processing 920 in accordance with disclosed embodiments; this apparatus 920 includes a processing chamber 922, a process gas unit 924, a substrate heating unit 926, and a substrate cooling unit 928. The processing chamber 922 has chamber walls 930 that at least partially bound and define a chamber interior 932 (which may be considered a plenum volume). The process gas unit 924 is configured to flow process gases, which may include liquids and/or gases, such as a reactant, modifying molecules, converting molecules, or removal molecules, onto a substrate 934 in the chamber interior 932. The process gas unit 924 also includes one or more flow features 942 configured to flow the first process gas onto the substrate 934, such as a hole, a nozzle (two of which are depicted), or a showerhead. The one or more flow features 942 may be positioned above, below, on the side, or a combination of positions, within the chamber interior 932, such as on the processing chamber walls, top, and bottom, for instance. The process gas unit 924 may include a mixing vessel for blending and/or conditioning process gases for delivery to the chamber interior 932. One or more mixing vessel inlet valves may control introduction of process gases to the mixing vessel.

The process gas unit 924 may include a first process gas source 936, a first process liquid source 938, a vaporization point (not depicted) which may vaporize the first liquid into a gas, and a carrier gas source 940. Some reactants may be stored in liquid form prior to vaporization and subsequent to delivery to the process chamber 922. The first process gas may comprise an oxidizing gas, a halogenating gas, or another gas configured to modify one or more layers of material on the substrate, without using a plasma, as described above. In some implementations, the vaporization point may be a heated liquid injection module. In some other implementations, the vaporization point may be a heated vaporizer. In yet other implementations, the vaporization point may be eliminated from the process station. In some implementations, a liquid flow controller (LFC) upstream of the vaporization point may be provided for controlling a mass flow of liquid for vaporization and delivery to the chamber interior 932. The carrier gas source 940 includes one or more carrier gases or liquids that may be flowed with the processing gas; these may be inert gases like $N_2$, Ar, Ne, He. The apparatus 920 may also include a vacuum pump 933 configured to pump the chamber interior to low pressures, such as a vacuum having a pressure of 1 mTorr or 10 Torr, for example.

The chamber interior 932 includes substrate support features 935 that are configured to support and thermally float a substrate 934 in the chamber. The substrate support features 935 may include clamps, horizontal pins or supports, vertical pins or supports, and semi-circular rings, for instance, that support the substrate 934 in the chamber interior 932. As noted above, these features are configured to support the substrate 934 such that the thermal mass of the substrate 934 is reduced as much as possible to the thermal mass of just the substrate. Each substrate support feature 935 may therefore have minimal contact with the substrate 934 and may be the smallest number of features required to adequately support the substrate during processing (e.g., in order to support the weight of the substrate and prevent inelastic deformation of the substrate). For instance, the surface area of one substrate support feature 935 in contact with a substrate may be less than about 1%, 0.5%, 0.1%, 0.05%, or 0.01% of the overall surface area of the back side of the substrate; also, for instance, 2, 3, or 4 features may be utilized.

In one example, the support features 935 may include two or more vertical pins that have grooves wrapped or spiraled along the vertical, longitudinal axis and that are offset at varying distances from the longitudinal axis and configured to support a substrate. When the vertical pin rotates along its longitudinal axis and the edge of a substrate is positioned in the groove, the edge of the groove, and therefore the edge of the substrate, moves farther away from the longitudinal axis. When multiple vertical pins are used to support a substrate, the rotation of the vertical pins causes the grooves to apply a supporting force to the substrate in a direction perpendicular to the longitudinal axis.

In some embodiments, the chamber 922 may include a wafer support pedestal that includes substrate lift pins. During thermal ALE processing, the lift pins may support and position the substrate away from the pedestal such that there is substantially no transference of thermal energy between the pedestal and substrate (e.g., less than 10%, 5%, 1%, 0.5%, or 0.1% of energy transferred between the two). In some other embodiments, the chamber 922 may not have a pedestal.

The substrate heating unit 926 is configured to heat the substrate to multiple temperatures and maintain such temperatures for at least 1 second, 5 seconds, or 10 seconds. This may include the heating in the manner described above in FIG. 5B. In some embodiments, the substrate heating unit 926 is configured to heat the substrate between at least two temperature ranges, with the first range between about 20° C. and 150° C., and the second range between about 200° C. and 600° C., as well as configured to maintain the substrate at a temperature within these ranges for at least 1 second, 5 seconds, or 10 seconds, for example. Additionally, in some embodiments, the substrate heating unit 926 is configured to heat the substrate from the first temperature range to the second temperature range in less than about 250 milliseconds, 150 milliseconds, 100 milliseconds, or 50 milliseconds, for instance.

The substrate heating unit 926 may utilize radiant heating, convective heating, laser heating, plasma heating, solid-to-solid thermal transference, or a combination of these items. For radiant heating, the substrate heating unit 926 maybe use infrared heating, ultraviolet heating, microwave heating, radio frequency heating, and induction heating. For example, the infrared heating may use one or more infrared emitters that emit infrared radiation in the 780 nanometer (nm) to 1400 nm range (e.g., a near infrared heater), in the 1400 nm and 3000 nm range (e.g., a medium infrared heater), and 3000 nm or above (e.g., a far infrared heater), for instance. This may include, for instance, a heat lamp, a ceramic heater, a quartz heater, or a Gradient Index (GRIN) Lens connected to a light energy source. The GRIN lens is configured to deliver heat energy (thermal or light) from the light energy source to the substrate in a uniform manner; the light source may be a laser or high-intensity light source that transmits the heat energy through a conduit, such as a fiber optic cable, to the GRIN lenses. The heating elements utilized by the substrate heating unit 926 may be positioned above, below, on the side, or a combination of the positions, the substrate 934, and they may be positioned inside, outside, or both, the chamber interior 932. In FIG. 9, the heating elements utilized by the substrate heating unit 926 include a plurality of heating lamps 926A that are positioned both above and below the substrate 934; the lower heating elements are positioned inside the chamber interior 932 and the upper heating elements are positioned outside the chamber interior 932. In some embodiments, for some of the heating elements that are positioned outside the chamber 922, the chamber 922 may have a window 954 that allows for the radiation to be transmitted into the chamber interior 932 and onto the substrate 934. In some embodiments, this window 954 may be an optical-grade quartz plate while in other embodiments it may be a transparent indium tin oxide (ITO) window.

Figure 10:
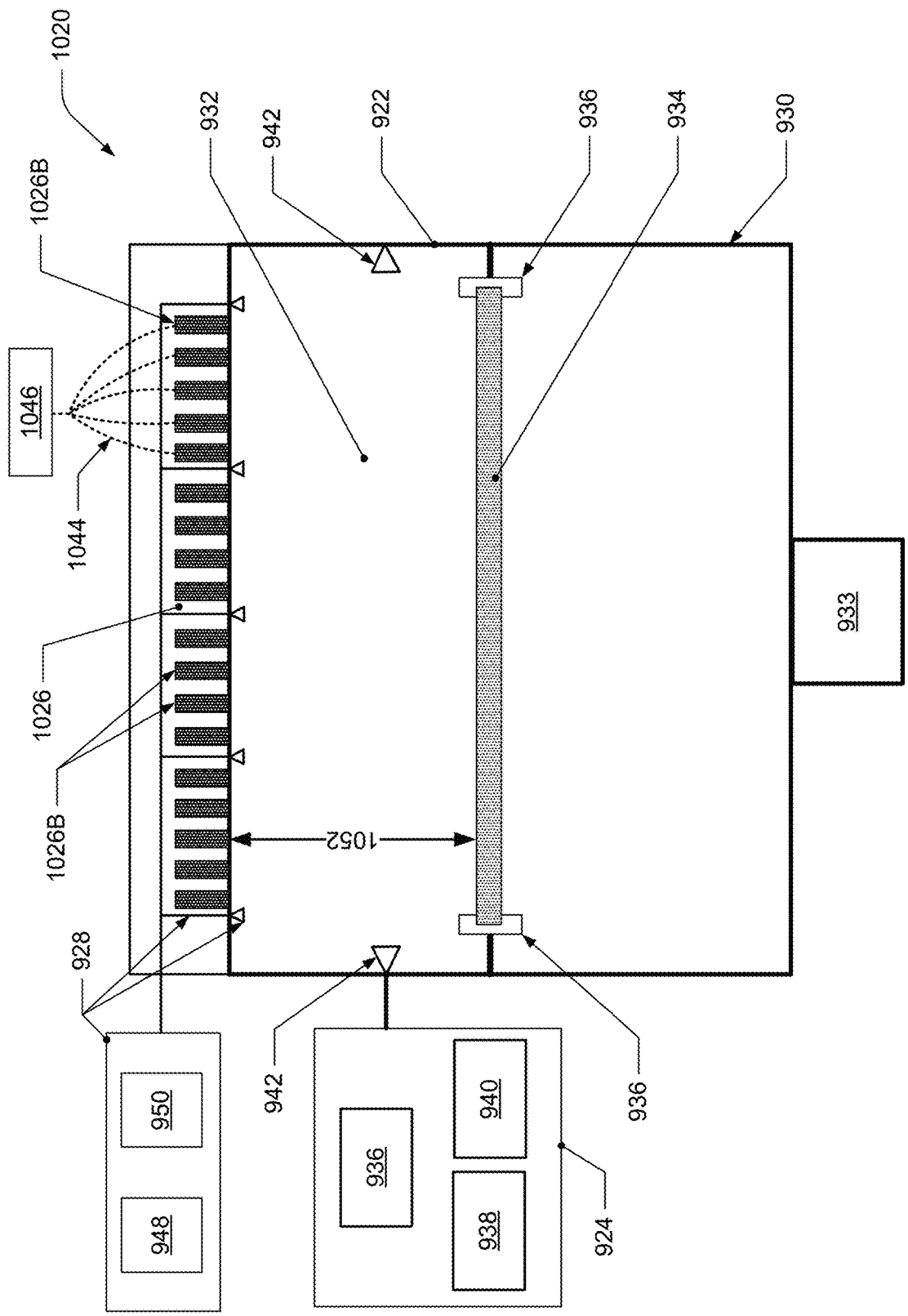
FIG. 10 depicts another apparatus for semiconductor processing in accordance with disclosed embodiments.

FIG. 10, depicts another apparatus for semiconductor processing in accordance with disclosed embodiments; this apparatus is similar to the apparatus 920 in FIG. 9, but the substrate heating unit 1026 uses GRIN lenses 1026B as the element for delivering light or heat energy from an outside light source (e.g., high-intensity light source or laser) to the substrate in a uniform manner. Each GRIN lens 1026B includes a fiber optic cable 1044, represented as a dotted line, that is connected to a light source 1046. The light source 1046 is configured to generate and transmit light of varying wavelengths, such as infrared wavelengths described above (e.g., 630 nm, 830 nm, 1060 nm, 1300 nm, or 1560 nm), and each GRIN lens 1026B is configured to transmit the emitted light onto the substrate 934. In some embodiments, the GRIN lenses 1026B are used to collimate the output of a fiber, including coupling the output of diode lasers into fibers or collimating laser light. Each GRIN lens may have an 8° or 0°, for instance, face angle. Many GRIN lenses do not require an air gap to function because the lens operates using varying indices in the lens itself, rather than the difference in indices between the air and lens. Additionally, in a GRIN lens, all optical paths (refractive index multiplied by distance) are the same due to the radially varying refractive index, in contrast to a spherical or aspheric lens. In some embodiments, a GRIN lens array may be connected to a single high energy source; for example, a GRIN lens array may be connected to a single laser diode with an output power of 10 W per diode. In some other embodiments, each GRIN lens may be connected to a separate high energy source; for instance, an array of N GRIN lenses may each be connected to an array of N diode lasers such that each GRIN lens is connected to a single, separate diode laser.

In some such embodiments, like those described below with respect to FIG. 12A, the GRIN lenses may be positioned within a plate, which may be made of a metal or metal alloy, so that each lens can emit light through the plate and into the chamber. This configuration is advantageous when an RF plasma source is combined with the chamber because the plate may be used as an RF ground while simultaneously allowing for the GRIN lenses to transmit the heating energy through the plate and into the chamber. Given the small diameter of GRIN lenses as compared to the diameter of the plate, this plate with the embedded GRIN lenses is a nearly intact solid plate from a grounding/RF point-of-view which enables the plate to serve as an adequate ground/RF electrode for RF plasma generation purposes. The GRIN lenses may be positioned behind a window other protective surface, or a part of them may be positioned inside the chamber interior.

For convective heating, the substrate heating unit 926 may flow a heating gas into the chamber interior 932 in order to heat the substrate. The substrate heating unit 926 may include a heating gas source, a heating unit configured to heat the heating gas to a desired temperature, such as at least 20° C., 100° C., 250° C., 350° C., 500° C., and 600° C., and heating flow features, such as nozzles or holes, like described above, that allow for the heating gas to flow into the chamber interior 932 and onto the substrate 934. These heating flow features may be positioned above, below, on the side of, or a combination, the substrate.

For laser heating, the substrate heating unit 926 may have one or more lasers that are configured to heat the substrate in the chamber interior. These lasers may be stationary or configured to move (e.g., a scanning laser), and they may be positioned above, below, or both, the substrate; the lasers may also be positioned inside, outside, or both, of the chamber interior. Similar to the radiant heating discussed above, for lasers that are positioned outside the chamber interior, the chamber may include a window that enables the light emissions of the laser to reach the substrate.

For plasma heating, the substrate heating unit 926 may have features configured to generate and maintain a plasma in the chamber interior to heat the substrate. Features that may generate a plasma are discussed in more detail below. In addition, in some embodiments, the chamber interior may include vertical pins that are positioned below the substrate and configured to support the wafer, like described above. During heating of the substrate, it may be supported by only the vertical pins and a plasma may be generated between the bottom of the substrate and a surface below the substrate, such as the bottom wall of the chamber or a wafer support pedestal. This plasma may heat and maintain the temperature of the substrate to the desired temperatures.

For solid-to-solid thermal transference, the substrate heating unit 926 may have one or more heating surfaces that are configured to contact and heat the substrate in the chamber interior. In some embodiments, the substrate heating unit 926 may have a heating platen, such as a flat surface or a surface of a substrate pedestal, that is configured to contact the back surface of the substrate and heat the substrate. This heating platen may have heating elements such as a heating coil, heating fluid, or radiative heating discussed above, that may heat the surface of the heating platen. The substrate may be heated when the back of the substrate is in direct contact with, or is offset from the heating platen but close enough to receive thermal energy from, the heating platen. When using this solid-to-solid thermal transference to heat the substrate, the substrate is separated from the heating platen when it is cooled. While some conventional ALE apparatuses may have a substrate pedestal that includes both heating and cooling elements, these apparatuses are unable to quickly (e.g., under 250 milliseconds) cycle between the temperatures of thermal ALE because of the large thermal masses of the pedestal that are repeatedly heated and cooled. For instance, as noted above, it may take multiple seconds or minutes to heat a pedestal from a first temperature range (e.g., 20° C. to 100° C.) to a second temperature range (e.g., 200° C. to 500° C.), as well as to cool the pedestal from the second temperature range to a lower temperature that can cool the substrate to the first temperature range. Accordingly, after using this solid-to-solid heating technique, the heating platen and the substrate are separated from each other which may be accomplished, for instance, by moving the substrate and/or the heating platen away from each other. Without this separation, cooling occurs of both the thermal mass of the substrate and the heating platen which increases the cooling time which decreases substrate throughput.

The substrate cooling unit 928 of FIG. 9 is configured to actively cool the substrate. In some embodiments, the substrate cooling unit 928 flows a cooling gas onto the substrate 934 which actively cools the substrate 934. The substrate cooling unit 928 may include a cooling fluid source 948 which may contain a cooling fluid (a gas or a liquid), and a cooler 950 configured to cool the cooling fluid to a desired temperature, such as less than or equal to 0° C., −50° C., −100° C., −150° C., −190° C., −200° C., and −250° C., for instance. The substrate cooling unit 928 includes piping and coolant flow features 952 (similar to the flow features 942, e.g., nozzles or holes) that are configured to flow the coolant fluid into the chamber interior 932. In some embodiments, the fluid may be in liquid state when it is flowed to the chamber 922 and may turn to a vapor state when it reaches the chamber interior 932, for example if the chamber interior 932 is at a low pressure state, such as described above, e.g., 1 Torr, for instance. The cooling fluid may be an inert element, such as nitrogen, argon, helium. In some embodiments, the flow rate of the cooling fluid into the chamber interior 932 may be at least 10 liters per second, 50 liters per second, 100 liters per second, 150 liters per second, 200 liters per second, 250 liters per second, and 300 liters per second, for example.

Figure 11:
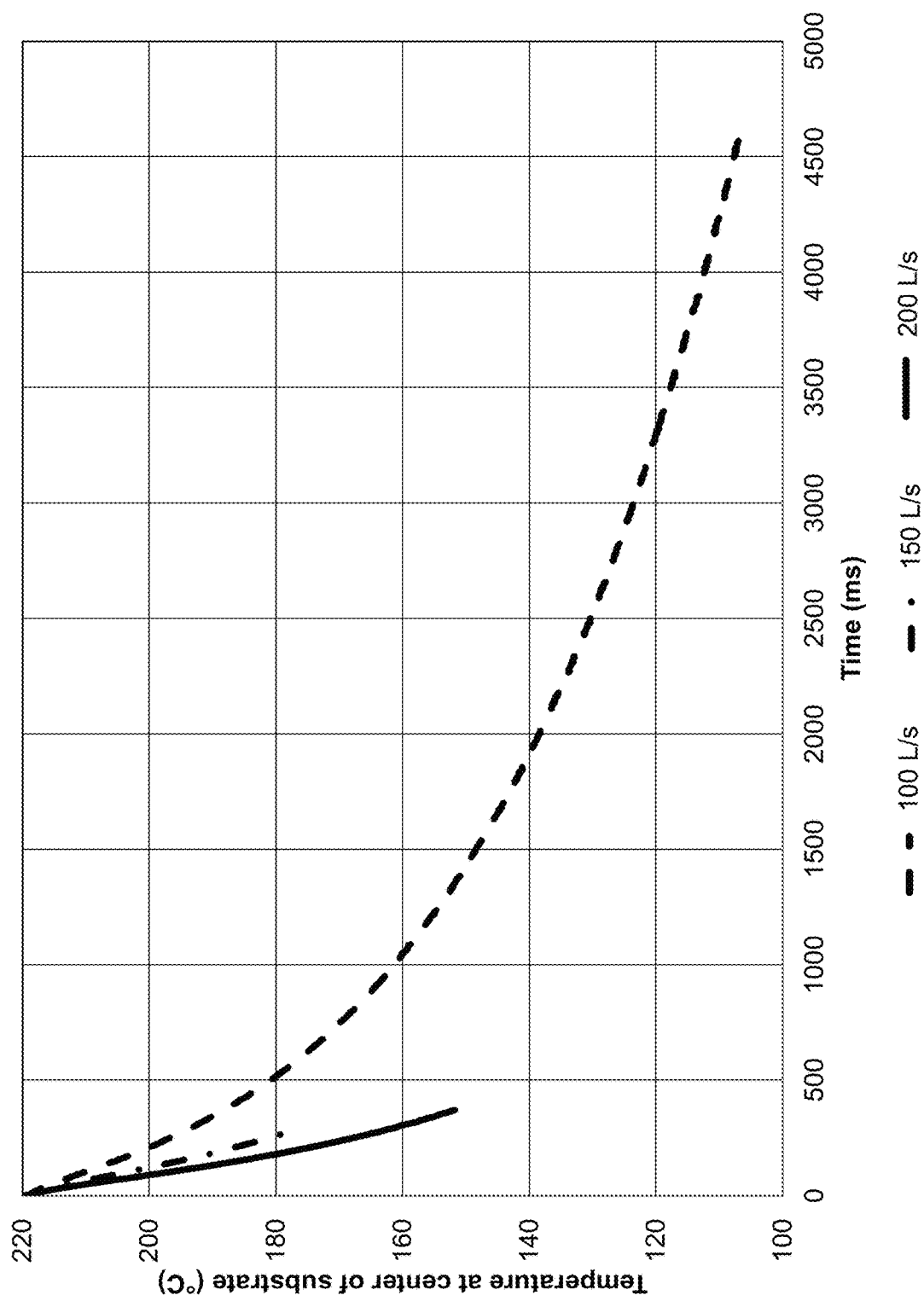
FIG. 11 depicts a graph of substrate cooling for various cooling fluid flow rates.

Various factors may increase the ability of the cooling fluid to cool the substrate. It has been discovered through various experiments that the higher the flow rate of the cooling fluid, the faster the substrate is cooled. In one example experiment, a cooling gas at about −196° C. flowed onto a substrate at a flow rate of 1 liter per second was found to reduce the temperature of a substrate from about 220° C. to about 215° C. in about 5,000 milliseconds, while the same cooling gas a flow rate of 10 liters per second reduced the temperature of a substrate from about 220° C. to about 195° C. in about 5,000 milliseconds. It was also discovered that a gap (1052 in FIG. 10) between the substrate and the top of the chamber may also affect the cooling of the substrate; the smaller the gap, the higher the cooling. In one instance, it was discovered that a substrate separated from the top of the chamber by a gap of about 50 millimeters was cooled from about 220° C. to about 215° C. in about 5,000 milliseconds using a cooling gas at about −196° C., while a substrate separated from the top of the chamber by a gap of about 5 millimeters was cooled from about 220° C. to about 209° C. in about 5,000 milliseconds using the same cooling gas. In another instance, substrates were positioned away from the top of the chamber by about 5 mm gap and various flow rates of the cooling fluid were used which are shown in FIG. 11 which depicts a graph of substrate cooling for various cooling fluid flow rates. As can be seen, it was found that a cooling gas at about −196° C. at a flow rate of 100 liters per second reduced the temperature of a substrate from about 220° C. to about 110° C. in about 4,500 milliseconds, the same cooling gas a flow rate of 150 liters per second reduced the temperature of a substrate from about 220° C. to about 175° C. in about 300 milliseconds, and the same cooling gas at a flow rate of 200 liters per second reduced the temperature of a substrate from about 220° C. to about 150° C. in about 300 milliseconds. In all of these examples, the conditions were the same except for the noted different conditions, such as flow rate of the cooling gas and separation gap. Accordingly, it was discovered that the higher the flow rate and the smaller the gap, the faster the substrate is cooled.

In some embodiments, the substrate cooling unit 928 may use solid-to-solid thermal transference to actively cool the substrate 934. In some of these embodiments, a cooling platen, such as a flat, cooled surface may be used to contact the bottom of the substrate and cool the substrate. This platen may be cooled by flowing a cooling fluid on, through, or underneath the platen. When using this solid-to-solid cooling, similar to the solid-to-solid heating discussed above, the substrate is separated from the cooling platen during heating of the substrate, such as by moving the substrate away from the cooling platen by, for instance, raising it up with lift pins. Without this separation, both the thermal masses of the substrate and cooling platen are cooled which requires more cooling that in turn increases process time and decreases throughput. In some embodiments, radiant heating of the top of the substrate or plasma heating of the bottom of the substrate may be used in conjunction with solid-to-solid cooling.

In some embodiments, the substrate cooling unit 928 may use laser cooling to cool the substrate. This may enable the cooling of a substrate that includes thulium molecules on at least the exposed surface of the substrate by utilizing a reverse Navier-Stokes reaction. For example, the temperature of the substrate manifests itself in phonons and the laser cooling emits photons to the substrate surface which interact with and pick-up phonons in the thulium, and then leave the substrate with the phonon from the thulium at a higher energy level. The removal of these phonons causes a decrease in the temperature of the substrate. The thulium may be doped onto the surface of the substrate in order to enable this laser cooling, and this doping may be incorporated into the techniques listed above, such as occurring after or before any operation, such as the removal operation.

As noted above, some embodiments of the apparatus may include a plasma source configured to generate a plasma within the chamber interior. These plasma sources may be a capacitively coupled plasma (CCP), an inductively coupled plasma (ICP), an upper remote plasma, and a lower remote plasma. FIGS. 12A and 12B depict example apparatuses with capacitively coupled plasmas. In these Figures, the chamber 1222 has been reduced in size and some elements and labels are removed from the apparatuses 1220A and 1220B for simplicity of illustration. In FIG. 12A, the substrate heating unit 1226 is a plate 1227 with a plurality of GRIN lenses 1226B embedded within the plate 1227 and a window 1254 that allows the substrate 1234 to be exposed to the radiation emitted by the GRIN lenses 1226B; the substrate cooling unit 1228 is depicted underneath the substrate 1234. The apparatus of FIG. 12A illustrates an integrated CCP, as seen by a plasma generator 1256 connected to the plate of the substrate heating unit 1226 which in turn is able to generate a plasma within the chamber interior 1232; part of this generation may also include flowing other process gases into the chamber interior that are ignited into a plasma by the plasma generator 1256. The plate 1227 may be a metal or a doped silicon, for instance, and may serve as the RF electrode or ground for plasma generation. The GRIN lenses 1226B in FIG. 9A, as well as any other embodiment herein, may arranged in an array within the plate 1258 such that radiation emitted by each GRIN lens may reach the substrate.

Figure 12A:
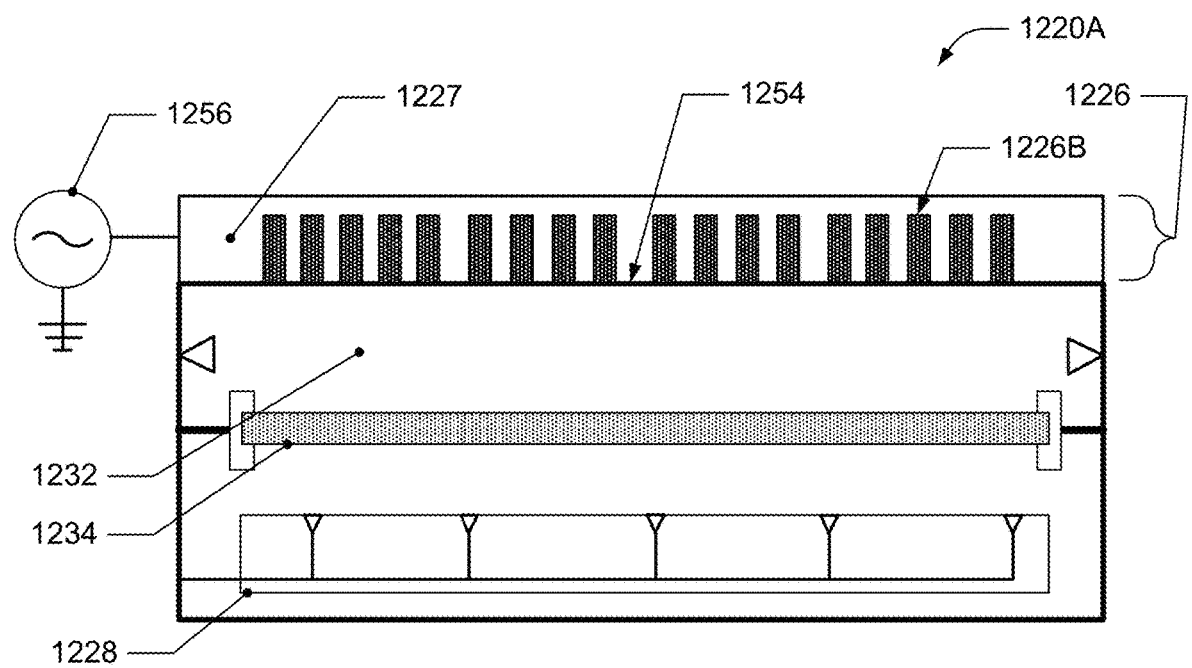
FIGS. 12A and 12B depict example apparatuses with capacitively coupled plasmas.
Figure 12B:
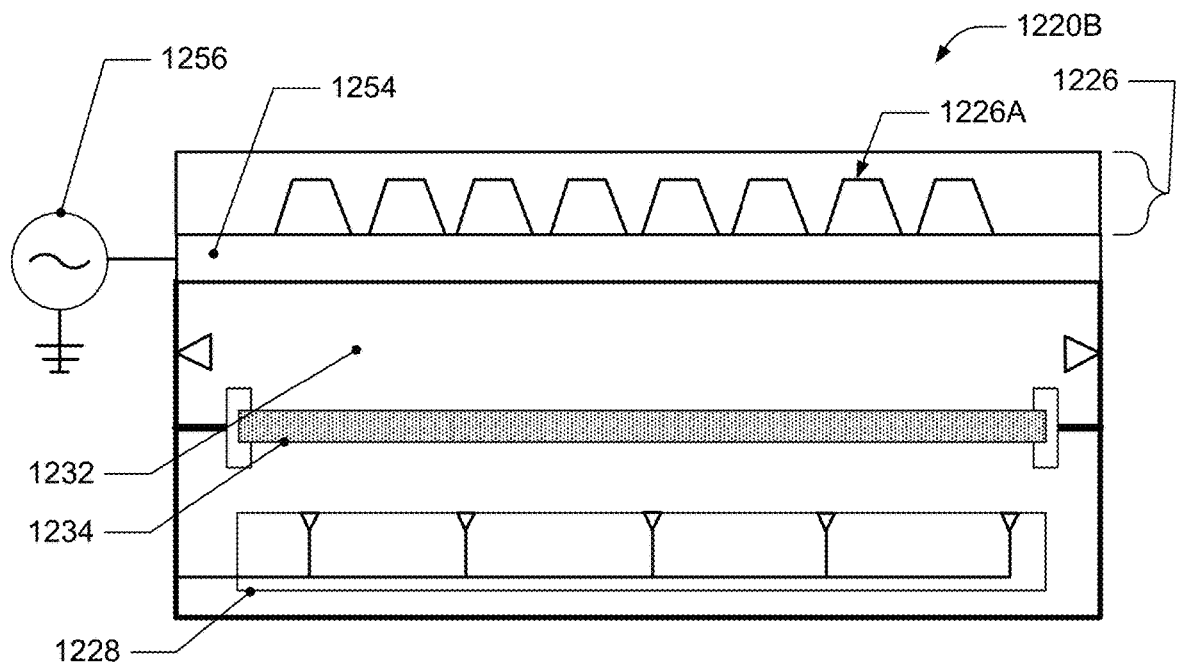

FIG. 12B depicts another apparatus with an integrated CCP similar to FIG. 12A, but the substrate heating unit 1226 is an array of heating lamps 1226A and an ITO window 1254 separates the substrate heating unit 1226 from the chamber interior 1232. The plasma generator 1256 is coupled to the ITO window 1254 which serves as an electrode for the plasma generator 1256 and may be grounded or powered.

Figure 13:
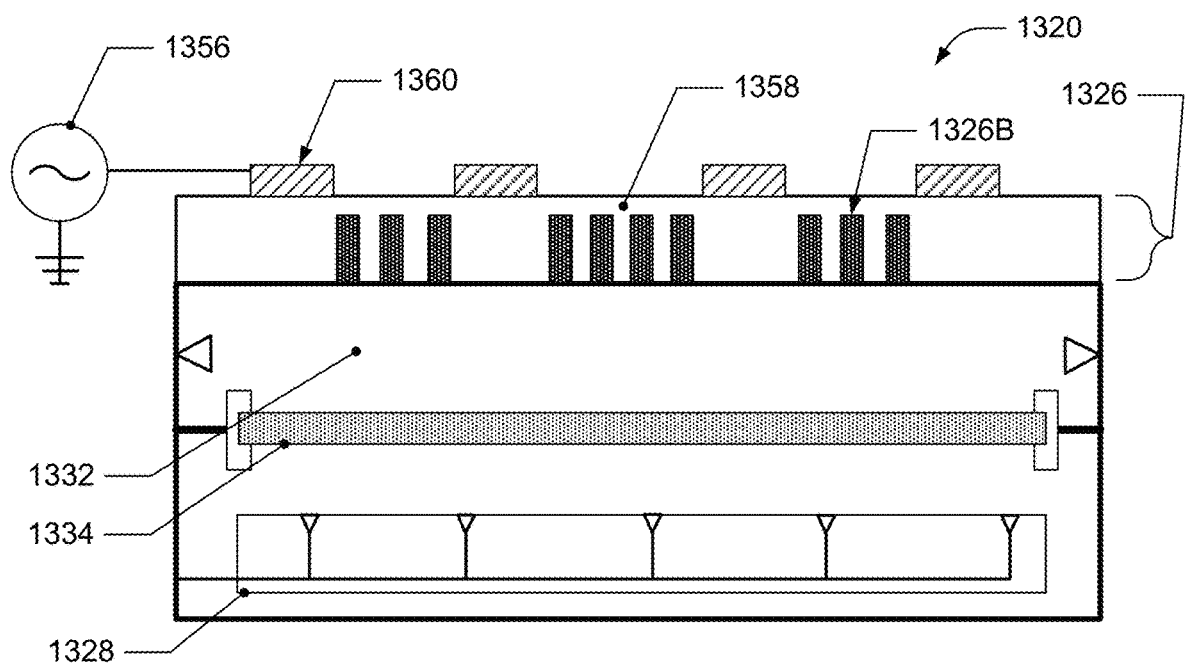
FIG. 13 depicts an example apparatus with an inductively coupled plasma.
Figure 14:
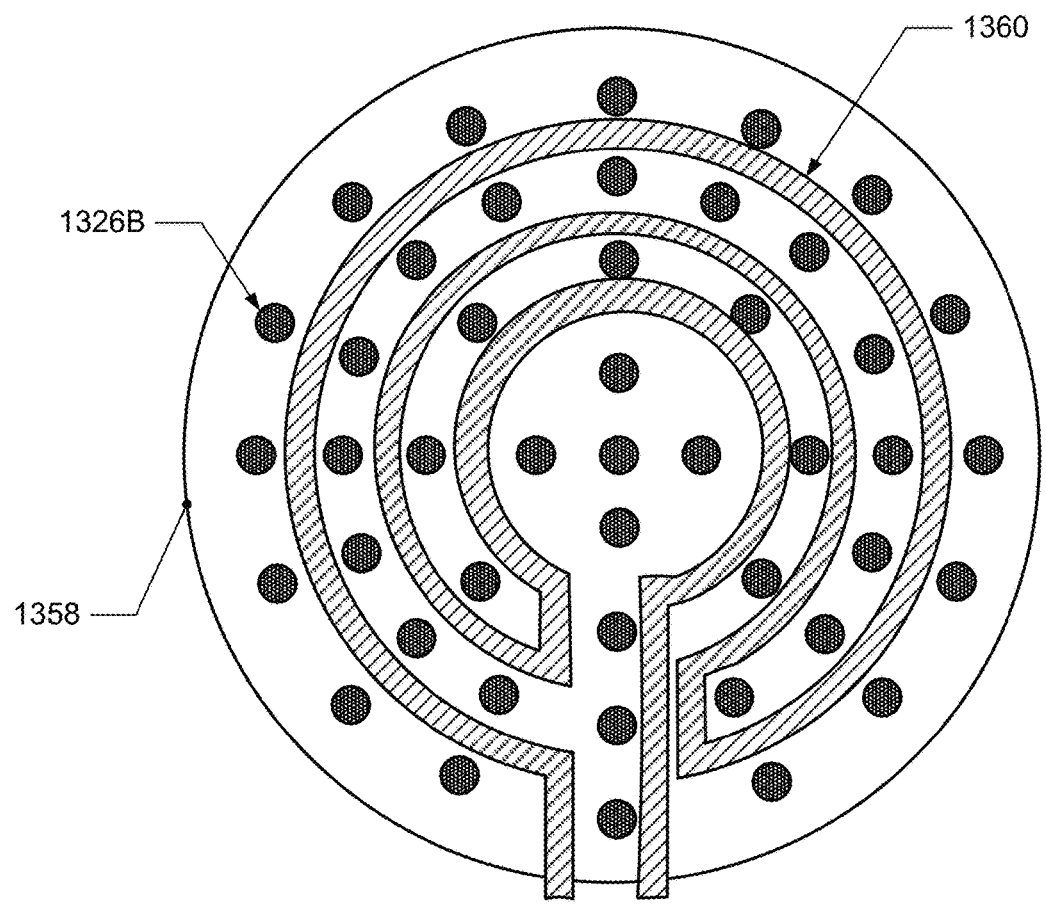
FIG. 14 depicts a bottom view of the ceramic window and ICP antenna of FIG. 13.

FIG. 13 depicts an example apparatus with an inductively coupled plasma (ICP). This apparatus is similar to that of FIG. 12A except for the plasma integration and arrangement of the GRIN lenses. For instance, the substrate heating unit 1326 includes an array of GRIN lenses 1326B that may be embedded within a ceramic window 1358, for instance. The antenna 1360 for the ICP is positioned above the ceramic window 1358 and outside the chamber interior 1332, and is configured to generate a plasma within the chamber interior 1332. The GRIN lenses are also arranged such that the antenna 1360, which may be a coiled antenna, does not overlap with the GRIN lenses as illustrated in FIG. 14 which depicts a bottom view of the ceramic window and ICP antenna of FIG. 13. As can be seen, when viewed from an angle perpendicular to the large surface area of the window, there is no overlap between the ICP antenna 1360 and the GRIN lenses 1326A, thereby reducing the interference between these two items and thereby enabling the generation of a plasma. Again, part of this generation may also include flowing other process gases into the chamber interior that are ignited into a plasma by the plasma generator 1356.

Figure 15A:
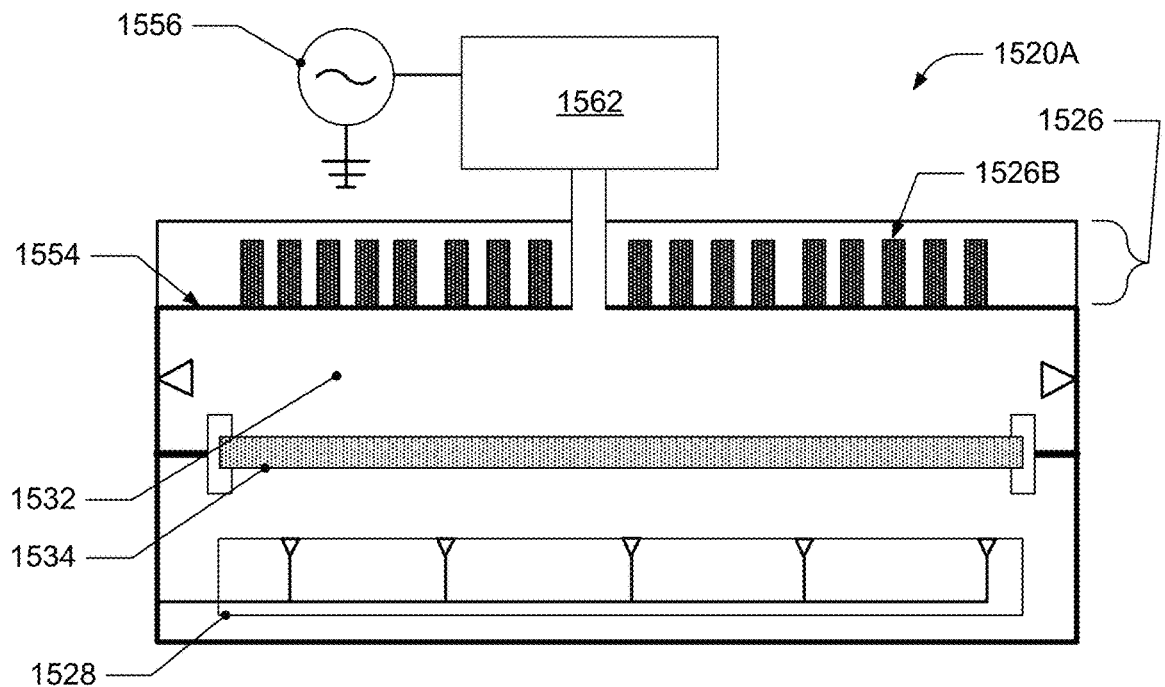
FIGS. 15A and 15B depict example apparatuses with remote plasmas.
Figure 15B:
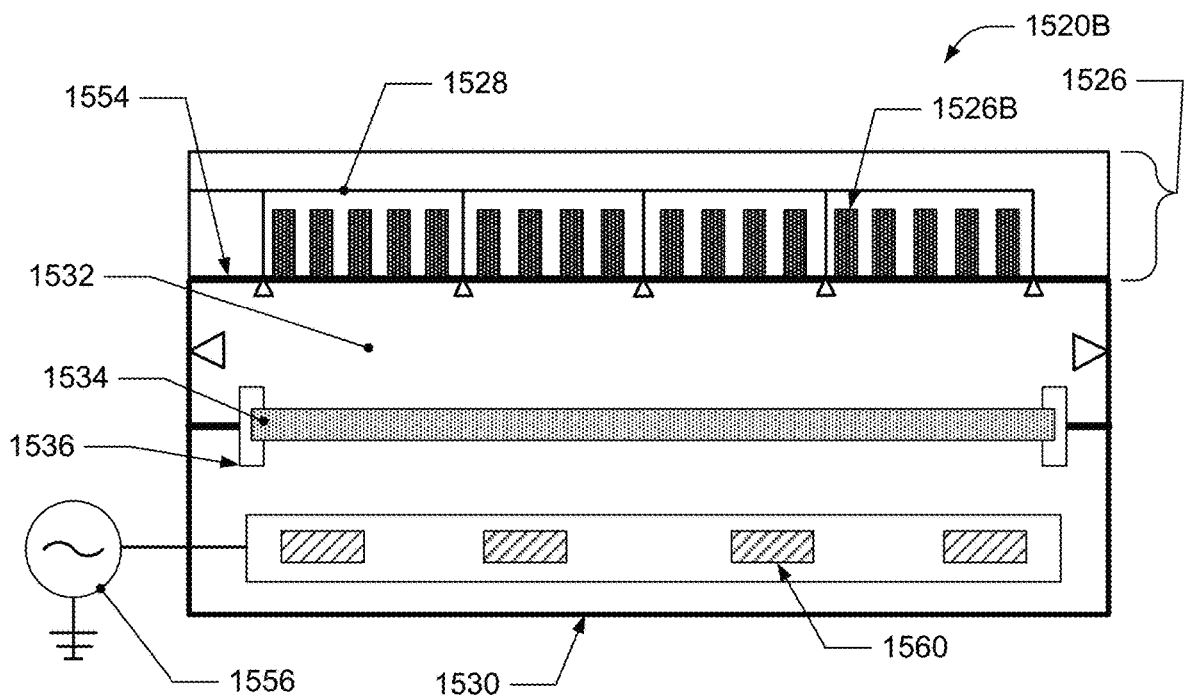

FIGS. 15A and 15B depict example apparatuses with remote plasmas. In these Figures, like in FIGS. 12A and 12B, the chamber 1522 has been reduced in size and some elements and labels are removed from the apparatuses 1520A and 1520B for simplicity of illustration. In FIG. 15A, like in FIG. 12A, the substrate heating unit 1526 is a plate with a plurality of GRIN lenses 1526B embedded within the plate and a window 1554 that allows the substrate 1534 to be exposed to the radiation emitted by the GRIN lenses 1526B; the substrate cooling unit 1528 is depicted underneath the substrate 1534. The apparatus of FIG. 12A illustrates an example upper remote plasma that includes a remote plasma source 1562 that generates a plasma using the plasma generator 1556; the plasma from the remote plasma source 1562 is then transported, e.g., flowed, through the substrate heating unit 1526 and the window 1554, and into the chamber interior 1532. The apparatus 1520A may include features that enable this remote plasma to be flowed into the chamber interior 1532, such as one or more holes, nozzles, or a showerhead. Although shown on the top, the remote plasma source 1562 may be positioned at any location and the entry point 1564 may be positioned above, below, on the side, or a combination of these locations, with respect to the substrate 1534.

FIG. 15B depicts an example lower remote plasma. Here, the substrate heating unit 1526, which includes GRIN lenses 9268, and substrate cooling unit 1528 are integrated together like in FIG. 10 such that they are both on the top of the chamber 922. Here, an ICP antenna 1560 is positioned lower than the substrate 1534 in the chamber interior 1532, e.g., it is positioned between the substrate 1334 or substrate supporting features 1535 and the bottom 1530 of the chamber. This ICP antenna 1560 is configured to cause the generation of a plasma within the chamber interior 1532; this may include, like discussed above, the flowing of a process gas into the process chamber 1532 that is configured to be ignited into a plasma. The ICP antenna 1560 may be configured similar to that of FIG. 14, e.g., a spiral arrangement, and it may be embedded within a ceramic material, for example.

In some embodiments, the apparatuses described herein may include a controller that is configured to control various aspects of the apparatus in order to perform the techniques described herein. For example, referring back to FIG. 9, apparatus 920 includes a controller 966 (which may include one or more physical or logical controllers) that is communicatively connected with and that controls some or all of the operations of a processing chamber. The system controller 966 may include one or more memory devices 968 and one or more processors 970. In some embodiments, the apparatus includes a switching system for controlling flow rates and durations, the substrate heating unit, the substrate cooling unit, the loading and unloading of a substrate in the chamber, the thermal floating of the substrate, and the process gas unit, for instance, when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, the controller 966 is part of an apparatus or a system, which may be part of the above-described examples. Such systems or apparatuses can include semiconductor processing equipment, including a processing tool or tools, chamber or chambers, a platform or platforms for processing, and/or specific processing components (a gas flow system, a substrate heating unit, a substrate cooling unit, etc.). These systems may be integrated with electronics for controlling their operation before, during, and after processing of a semiconductor wafer or substrate. The electronics may be referred to as the "controller," which may control various components or subparts of the system or systems. The controller 966, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 966 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller 966, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 966 receives instructions in the form of data, which specify parameters for each of the processing operations to be performed during one or more operations. It should be understood that the parameters may be specific to the type of process to be performed and the type of tool that the controller is configured to interface with or control. Thus as described above, the controller 966 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

As noted above, depending on the process operation or operations to be performed by the apparatus, the controller 966 might communicate with one or more of other apparatus circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

As also stated above, the controller is configured to perform any technique described above. For instance, referring to apparatus 920 of FIG. 9 and technique of FIG. 1, in some embodiments the controller 966 is configured to cause the substrate heating unit 926 to bring (i.e., heat or actively cool) the substrate 934 positioned on the substrate support features 935 to a first temperature, and cause the process gas unit 924 to flow the first process gas to the substrate 934. As noted above, the first process gas is configured to modify one or more surface layers of material on the substrate 934 by chemical adsorption without using a plasma while the substrate is maintained at the first temperature. The controller may further be configured to cause, after the modifying, the substrate heating unit 926 to maintain the substrate 934 at the second temperature and the one or more modified surface layers on the substrate 934 may be removed by desorption without using a plasma while the substrate 934 is maintained at the second temperature.

After this, the controller may then repeat these operations in order to etch multiple layers of material from the substrate. Depending on whether the first temperature is lower or higher than the second temperature, the controller may be configured to cause the heating unit to heat, or the cooling unit to actively cool, the substrate from the second temperature to the first temperature in order to perform another modifying operation. For example, in some embodiments in which the second temperature is lower than the first temperature, the controller may include instructions to cause the substrate cooling unit 928 to actively cool the substrate 934 to the second temperature after the modifying, and to cause the substrate heating unit 926 to heat the substrate to the first temperature after the removal by desorption. In some other embodiments in some embodiments in which the first temperature is lower than the first temperature, the controller may include instructions to cause the substrate heating unit 926 to heat the substrate 934 to the second temperature after the modifying, and to cause the substrate cooling unit 928 to actively cool the substrate to the first temperature after the removal by desorption.

What is claimed is:

1. A method of processing a substrate, the method comprising:
   supporting and thermally floating a substrate in a processing chamber using one or more substrate supports configured to minimize contact with the substrate;
   modifying one or more surface layers of material on the substrate by chemical adsorption, without using a plasma, while the substrate is maintained at a first temperature; and
   removing the one or more modified surface layers on the substrate by desorption, without using a plasma, while the substrate is maintained at a second temperature, wherein the first temperature is different from the second temperature;
   repeating, while the substrate remains in the processing chamber, the modifying of one or more surface layers of material on the substrate by chemical adsorption and the removing the one or more modified surface layers on the substrate by desorption;
   heating, after the modifying, the substrate from the first temperature to the second temperature; and
   actively cooling, after the removing, the substrate from the second temperature to the first temperature;
   wherein:
   the heating further comprises one of: heating the substrate from a top direction, heating the substrate from a bottom direction, and heating the substrate from both the top and the bottom directions, and
   the cooling further comprises one of: cooling the substrate from the top direction, cooling the substrate from the bottom direction, and cooling the substrate from both the top and the bottom directions;
   and wherein:
   the heating further comprises heating the substrate to the second temperature in about 250 milliseconds or less, and the cooling further comprises actively cooling the substrate to the first temperature in about 250 milliseconds or less.

2. The method of claim 1, wherein the second temperature is higher than the first temperature.

3. The method of claim 1, wherein the modifying further comprises modifying a metal or metal oxide on the one or more surface layers of material on the substrate by chemical adsorption, without using a plasma.

4. The method of claim 1, further comprising:
   purging the processing chamber.

5. The method of claim 1, wherein the removing further comprises heating the substrate in order to maintain the substrate temperature constant at the second temperature.

6. The method of claim 1, wherein the removing further comprises desorbing 90% or more of the one or more modified surface layers from the substrate.

7. The method of claim 1, wherein:
   the modifying further comprises maintaining the substrate at the first temperature for about 1 second to about 5 seconds, and
   the removing further comprises maintaining the substrate at the second temperature for about 1 second to about 5 seconds.

8. The method of claim 1, wherein:
   the heating further comprises using at least one of: radiant heating, convective heating, and plasma heating, and
   the cooling further comprises using at least one of: convective cooling and laser cooling.

9. The method of claim 8, wherein the cooling further comprises flowing a cooling gas onto the substrate.

10. The method of claim 1, further comprising:
    flowing, before or during the modifying, a first process gas onto the substrate, wherein the first process gas is configured to modify the one or more surface layers of material on the substrate.

11. The method of claim 10, wherein the first process gas is a halogenating gas or an oxidizing gas.

12. The method of claim 1, further comprising:
    converting, after the modifying and before, or during, the removing, the one or more modified surface layers on the substrate to a converted layer, wherein:

the removing further comprises removing the converted layer on the substrate by desorption, without using a plasma, while the substrate is maintained at the second temperature.

13. The method of claim 12, wherein:

the converting further comprises flowing a second process gas onto the substrate, wherein the second process gas is configured to convert the one or more modified surface layers on the substrate to the converted layer.

14. The method of claim 1, further comprising:

generating, not during the modifying and the removing, a plasma in the processing chamber and cleaning one or more of: a surface of the processing chamber and a surface of the substrate.

15. The method of claim 14, wherein the generating occurs before the modifying, after the removing, or before the modifying and after the removing.

16. A method of processing a substrate, the method comprising:

supporting and thermally floating a substrate in a processing chamber;

modifying one or more surface layers of material on the substrate by chemical adsorption, without using a plasma, while the substrate is maintained at a first temperature;

heating, after the modifying, the substrate from the first temperature to the second temperature in about 250 milliseconds or less, wherein the heating comprises one of: heating the substrate from a top direction, heating the substrate from a bottom direction, and heating the substrate from both the top and the bottom directions;

removing the one or more modified surface layers on the substrate by desorption, without using a plasma, while the substrate is maintained at a second temperature, wherein the first temperature is different from the second temperature; and actively cooling, after the removing, the substrate from the second temperature to the first temperature in about 250 milliseconds or less, wherein the cooling comprises one of: cooling the substrate from the top direction, cooling the substrate from the bottom direction, and cooling the substrate from both the top and the bottom directions.

* * * * *